United States Patent
Choi et al.

(10) Patent No.: US 8,865,252 B2
(45) Date of Patent: Oct. 21, 2014

(54) THIN FILM DEPOSITION APPARATUS AND METHOD OF MANUFACTURING ORGANIC LIGHT-EMITTING DISPLAY DEVICE BY USING THE SAME

(75) Inventors: Yong Sup Choi, Yongin (KR);
Myeng-Woo Nam, Yongin (KR);
Jong-Won Hong, Yongin (KR);
Seok-Rak Chang, Yongin (KR);
Eun-Sun Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 653 days.

(21) Appl. No.: 13/031,756

(22) Filed: Feb. 22, 2011

(65) Prior Publication Data
US 2011/0244120 A1    Oct. 6, 2011

(30) Foreign Application Priority Data
Apr. 6, 2010    (KR) .................. 10-2010-0031556

(51) Int. Cl.
| C23C 16/00 | (2006.01) |
| B05D 5/06 | (2006.01) |
| H01L 21/677 | (2006.01) |
| H01L 51/56 | (2006.01) |
| H01L 21/67 | (2006.01) |
| H01L 21/673 | (2006.01) |
| H01L 21/687 | (2006.01) |

(52) U.S. Cl.
CPC ............ *H01L 21/6776* (2013.01); *H01L 51/56* (2013.01); *H01L 21/67173* (2013.01); *H01L 21/6732* (2013.01); *H01L 21/68764* (2013.01)
USPC .......................... 427/162; 427/248.1; 118/500

(58) Field of Classification Search
None
See application file for complete search history.

(56) References Cited

U.S. PATENT DOCUMENTS

| 4,416,217 A | 11/1983 | Nakamura et al. |
| 4,468,648 A | 8/1984 | Uchikune |

(Continued)

FOREIGN PATENT DOCUMENTS

| CN | 1476279 A | 2/2004 |
| CN | 1489419 A | 4/2004 |

(Continued)

OTHER PUBLICATIONS

KIPO Office action dated Apr. 9, 2012, for Korean priority Patent application 10-2010-0031556, (4 pages).

(Continued)

*Primary Examiner* — Joseph Miller, Jr.
(74) *Attorney, Agent, or Firm* — Christie, Parker & Hale, LLP

(57) ABSTRACT

A thin film deposition apparatus that can be easily used to manufacture large-sized display devices on a mass scale and that improves manufacturing yield, and a method of manufacturing an organic light-emitting display device by using the thin film deposition apparatus. The thin film deposition apparatus includes: a loading unit to place a substrate, which is a deposition target, on an electrostatic chuck; a deposition unit including a chamber, and a thin film deposition assembly that is disposed in the chamber and forms a thin film on the substrate placed on the electrostatic chuck; an unloading unit to separate the substrate on which deposition is completed from the electrostatic chuck; a first conveyor unit to sequentially move the electrostatic chuck having the substrate thereon to the loading unit, to the deposition unit, and finally, to the unloading unit, wherein the first conveyor unit includes: one pair of first guide rails and one pair of second guide rails disposed in parallel; at least one first guide block engaged with the first guide rails, respectively; and at least one second guide block engaged with the second guide rails, respectively.

30 Claims, 16 Drawing Sheets

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1* | 1/2005 | Klug et al. ............... 118/726 |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1* | 5/2006 | Fairbairn et al. ............... 118/719 |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0255722 A1 | 11/2006 | Imanishi |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1* | 1/2007 | Manz et al. ............... 427/58 |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |

(56) References Cited

U.S. PATENT DOCUMENTS

| | | |
|---|---|---|
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100201 A1 | 5/2008 | Wei et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0286461 A1* | 11/2008 | Noguchi et al. ............ 427/248.1 |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1* | 9/2009 | Kim et al. ...................... 118/726 |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1* | 12/2009 | Gadgil ........................ 427/255.5 |
| 2009/0308317 A1* | 12/2009 | Sone et al. .................... 118/719 |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0255198 A1 | 10/2010 | Cleary et al. |
| 2010/0271602 A1 | 10/2010 | Hanazaki et al. |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0068201 A1 | 3/2012 | Sung et al. |
| 2012/0083061 A1 | 4/2012 | Kang et al. |
| 2012/0097992 A1 | 4/2012 | Jeong |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0214263 A1 | 8/2012 | Yamazaki et al. |
| 2012/0288619 A1 | 11/2012 | Choi et al. |
| 2012/0299023 A1 | 11/2012 | Lee et al. |
| 2012/0313251 A1 | 12/2012 | Kato |
| 2013/0001528 A1 | 1/2013 | Chang et al. |
| 2013/0009177 A1 | 1/2013 | Chang et al. |
| 2013/0298829 A1 | 11/2013 | Jo et al. |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 | 4/2004 |
| EP | 1 418 250 A2 | 5/2004 |
| EP | 1 518 940 | 3/2005 |
| JP | 57-194252 A2 | 11/1982 |
| JP | 2-247372 | 10/1990 |
| JP | 4-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-68054 | 3/2000 |
| JP | 2000-282219 | 10/2000 |
| JP | 2000-323277 | 11/2000 |
| JP | 2001-28325 A2 | 1/2001 |
| JP | 2001-52862 | 2/2001 |
| JP | 2001-93667 | 4/2001 |
| JP | 2002-075638 | 3/2002 |
| JP | 2002-175878 | 6/2002 |
| JP | 2002-348659 A2 | 12/2002 |
| JP | 2003-3250 | 1/2003 |
| JP | 2003-77662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2003-347394 | 12/2003 |
| JP | 2004-035964 A2 | 2/2004 |
| JP | 2004-43898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 | 6/2004 |
| JP | 2004-199919 | 7/2004 |
| JP | 2004-225058 | 8/2004 |
| JP | 2004-342455 | 12/2004 |
| JP | 2004-349101 | 12/2004 |
| JP | 2004-355975 | 12/2004 |
| JP | 2005-44592 | 2/2005 |

(56) References Cited

FOREIGN PATENT DOCUMENTS

| | | |
|---|---|---|
| JP | 2005-101505 | 4/2005 |
| JP | 2005-122980 | 5/2005 |
| JP | 2005-165015 A2 | 6/2005 |
| JP | 2005-174843 | 6/2005 |
| JP | 2005-206939 A2 | 8/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 | 8/2006 |
| JP | 2006-219760 | 8/2006 |
| JP | 2006-275433 | 10/2006 |
| JP | 2006-292955 A2 | 10/2006 |
| JP | 2006-307247 | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-242436 | 9/2007 |
| JP | 2007-291506 A2 | 11/2007 |
| JP | 2008-019477 | 3/2008 |
| JP | 2008-108628 | 5/2008 |
| JP | 2008-121098 | 5/2008 |
| JP | 2008-521165 | 6/2008 |
| JP | 2008-196003 | 8/2008 |
| JP | 2008-248301 A2 | 10/2008 |
| JP | 2008-300056 | 12/2008 |
| JP | 2009-19243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 | 5/2009 |
| JP | 2010-159167 | 7/2010 |
| JP | 2010-261081 A2 | 11/2010 |
| JP | 2011-47035 | 3/2011 |
| JP | 2011-146377 | 7/2011 |
| JP | 2012-211352 | 11/2012 |
| KR | 1997-0008709 | 2/1997 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0088662 | 11/2002 |
| KR | 10-2002-0090934 | 12/2002 |
| KR | 10-2002-0091457 A | 12/2002 |
| KR | 10-2003-0001745 | 1/2003 |
| KR | 2003-0034730 A | 5/2003 |
| KR | 10-2003-0043012 | 6/2003 |
| KR | 10-2003-0046090 | 6/2003 |
| KR | 2003-0069684 | 8/2003 |
| KR | 10-0406059 | 11/2003 |
| KR | 10-2003-0091947 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 A1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-2005-0018234 A | 2/2005 |
| KR | 10-2005-0024324 | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 | 6/2005 |
| KR | 10-2005-0082644 A | 8/2005 |
| KR | 10-0532657 B1 | 12/2005 |
| KR | 10-2006-0008602 | 1/2006 |
| KR | 10-2006-0018745 | 3/2006 |
| KR | 10-2006-0020050 | 3/2006 |
| KR | 10-2006-0045225 A | 5/2006 |
| KR | 10-2006-0049050 | 5/2006 |
| KR | 10-2006-0051746 A | 5/2006 |
| KR | 10-2006-0053926 A | 5/2006 |
| KR | 10-2006-0056706 | 5/2006 |
| KR | 10-2006-0058459 | 5/2006 |
| KR | 10-2006-0058459 A | 5/2006 |
| KR | 10-2009-0052828 A | 5/2006 |
| KR | 10-2006-0059068 | 6/2006 |
| KR | 10-2006-0059323 A | 6/2006 |
| KR | 10-2006-0060994 | 6/2006 |
| KR | 10-2006-0065978 | 6/2006 |
| KR | 10-2006-0073367 | 6/2006 |
| KR | 10-2006-0077887 A | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-2006-0123944 A | 12/2006 |
| KR | 10-0687007 | 2/2007 |
| KR | 10-2007-0025164 | 3/2007 |
| KR | 10-0696547 | 3/2007 |
| KR | 10-0696550 B1 | 3/2007 |
| KR | 10-0697663 B1 | 3/2007 |
| KR | 10-2007-0035796 | 4/2007 |
| KR | 10-2007-0037848 A | 4/2007 |
| KR | 10-2007-0050793 | 5/2007 |
| KR | 10-0723627 | 5/2007 |
| KR | 10-2007-0056190 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0080635 | 8/2007 |
| KR | 10-2007-0091437 | 9/2007 |
| KR | 10-2006-0028115 | 10/2007 |
| KR | 10-2007-0098122 A | 10/2007 |
| KR | 10-2007-0105595 | 10/2007 |
| KR | 10-0768212 B1 | 10/2007 |
| KR | 10-0770653 | 10/2007 |
| KR | 10-2007-0112668 | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 | 1/2008 |
| KR | 10-2008-0009285 | 1/2008 |
| KR | 10-0800125 | 1/2008 |
| KR | 10-2008-0036983 A | 4/2008 |
| KR | 10-0823508 | 4/2008 |
| KR | 10-0823511 B1 | 4/2008 |
| KR | 10-2008-0044239 | 5/2008 |
| KR | 10-2008-0044775 | 5/2008 |
| KR | 10-2008-0046761 | 5/2008 |
| KR | 10-2008-0048653 | 6/2008 |
| KR | 10-2008-0055124 A | 6/2008 |

(56) References Cited

FOREIGN PATENT DOCUMENTS

| KR | 10-2008-0057159 | | 6/2008 |
|---|---|---|---|
| KR | 10-2008-0060400 | | 7/2008 |
| KR | 10-2008-0061132 | | 7/2008 |
| KR | 10-2008-0061666 | A | 7/2008 |
| KR | 10-2008-0061774 | A | 7/2008 |
| KR | 10-2008-0062212 | | 7/2008 |
| KR | 10-2008-0076574 | | 8/2008 |
| KR | 10-2008-0088737 | A | 10/2008 |
| KR | 10-2008-0104479 | | 12/2008 |
| KR | 10-2008-0104695 | | 12/2008 |
| KR | 10-2008-0109559 | | 12/2008 |
| KR | 10-2009-0017910 | A | 2/2009 |
| KR | 10-0889872 | B1 | 3/2009 |
| KR | 10-2009-0038733 | | 4/2009 |
| KR | 10-2009-0040618 | | 4/2009 |
| KR | 10-2009-0047953 | A | 5/2009 |
| KR | 10-2009-0052155 | | 5/2009 |
| KR | 10-2009-0053417 | | 5/2009 |
| KR | 10-0899279 | B1 | 5/2009 |
| KR | 10-2009-0066996 | | 6/2009 |
| KR | 10-2009-0075887 | A | 7/2009 |
| KR | 10-2009-0079765 | A | 7/2009 |
| KR | 10-2009-0081717 | | 7/2009 |
| KR | 10-0908232 | B1 | 7/2009 |
| KR | 10-2009-0093161 | | 9/2009 |
| KR | 10-2009-0094911 | | 9/2009 |
| KR | 10-2009-0107702 | | 10/2009 |
| KR | 10-0922763 | A | 10/2009 |
| KR | 10-2010-0000128 | | 1/2010 |
| KR | 10-2010-0000129 | | 1/2010 |
| KR | 10-2010-0002381 | A | 1/2010 |
| KR | 10-2010-0026655 | | 3/2010 |
| KR | 10-2010-0038088 | | 4/2010 |
| KR | 10-2010-0044606 | | 4/2010 |
| KR | 10-2010-0047796 | | 5/2010 |
| KR | 10-0961110 | B1 | 6/2010 |
| KR | 10-2010-0090070 | | 8/2010 |
| KR | 10-2010-0099806 | A | 9/2010 |
| KR | 10-2010-0119368 | A | 11/2010 |
| KR | 10-2010-0126125 | A | 12/2010 |
| KR | 10-2010-0128589 | | 12/2010 |
| KR | 10-2010-0130786 | A | 12/2010 |
| KR | 10-2010-0133678 | A | 12/2010 |
| KR | 10-2010-0138139 | A | 12/2010 |
| KR | 10-101-7654 | B1 | 2/2011 |
| KR | 10-2011-0021090 | A | 3/2011 |
| KR | 10-2011-0022512 | A | 3/2011 |
| KR | 10-2011-0032589 | A | 3/2011 |
| KR | 10-2011-0082418 | A | 7/2011 |
| KR | 2011-0101767 | | 9/2011 |
| KR | 10-2011-0110525 | A | 10/2011 |
| KR | 10-2011-0120213 | A | 11/2011 |
| KR | 10-2011-0138787 | A | 12/2011 |
| KR | 10-2012-0006322 | A | 1/2012 |
| KR | 10-2012-0006324 | A | 1/2012 |
| KR | 10-2012-0042155 | A | 5/2012 |
| KR | 10-2012-0065789 | A | 6/2012 |
| KR | 10-2012-0080855 | A | 7/2012 |
| KR | 10-2012-0081811 | A | 7/2012 |
| KR | 10-2012-0131545 | A | 12/2012 |
| KR | 10-2013-0007308 | A | 1/2013 |
| WO | WO 99/25894 | A1 | 5/1999 |
| WO | WO 03/043067 | A1 | 5/2003 |
| WO | WO 2004/016406 | | 2/2004 |
| WO | 2008004792 | A1 | 1/2008 |

OTHER PUBLICATIONS

KIPO Notice of Allowance dated Apr. 26, 2012, for Korean Patent application 10-2010-0066991, (5 pages).
Korean Patent Abstracts, Publication No. 10-0151312 B1, dated Jun. 18, 1998, corresponding to Korean Publication 1997-0008709 listed above.
Korean Patent Abstracts, Publication No. 10-2007-0056241, dated Jun. 4, 2007, corresponding to Korean Patent 10-0741142 B1 listed above.
Korean Patent Abstracts, Publication No. 10-2008-0070302, dated Jul. 30, 2008, corresponding to Korean Patent 10-0899279 B1 listed above.
KIPO Registration Determination Certificate dated Jul. 2, 2012, for Korean Patent application 10-2010-0011480, (5 pages).
KIPO Registration Determination Certificate dated Jul. 2, 2012, for Korean priority Patent application 10-2010-0011481, (5 pages).
U.S. Office action dated Oct. 3, 2012, for cross reference U.S. Appl. No. 12/869,830, (28 pages).
U.S. Office action dated Jun. 21, 2011, for cross reference U.S. Appl. No. (12/862,153, now U.S. Patent 8,137,466), 21 pages.
European Search Report dated May 27, 2011, for European Patent application 10251514.5, 11 pages.
KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.

(56) References Cited

OTHER PUBLICATIONS

U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Appl. No. 13/725,610, filed Dec. 21, 2012, Kim.
U.S. Appl. No. 13/938,173, filed Jul. 9, 2013, Lee et al.
U.S. Appl. No. 13/791,899, filed Mar. 8, 2013, Han.
U.S. Appl. No. 13/941,424, filed Jul. 12, 2013, Kim.
U.S. Appl. No. 14/079,522, Nov. 13, 2013, Voronov et al.
English machine translation of Japanese Publication 2004-349101 dated Dec. 9, 2004, listed above, (10 pages).
Korean Patent Abstracts for Korean Publication 10-2007-0097218 dated Oct. 4, 2007, corresponding to Korean Patent 10-0768212 dated Oct. 18, 2007 listed above.
KIPO Registration Determination Certificate dated Nov. 25, 2011, for Korean priority Patent application 10-2010-0014277, (5 pages).
KIPO Registration Determination Certificate dated Sep. 28, 2011, for Korean Patent application 10-2009-0052357, (5 pages).
KIPO Registration Determination Certificate dated Jan. 13, 2012, for Korean patent application 10-2009-0056529, (5 pages).
KIPO Office action dated Feb. 1, 2012, for Korean patent application 10-2010-0031848, (4 pages).
KIPO Office action dated Feb. 1, 2012, for Korean patent application 10-2010-0011196, (4 pages).
KIPO Registration Determination Certificate dated Jul. 20, 2012, for Korean Patent application 10-010-0003545, (5 pages).
KIPO Registration Determination Certificate dated Apr. 30, 2012, for Korean priority Patent application 10-2010-0066992, (5 pages).
KIPO Office action dated Sep. 1, 2012, for Korean Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
JPO Office action dated Aug. 21, 2012, for corresponding Japanese Patent application 2010-145075, (5 pages).
Japanese Office action dated Sep. 4, 2012, for Japanese Patent application 2010-152846, (4 pages).
U.S. Office action dated Dec. 20, 2012 for cross reference U.S. Appl. No. 12/984,289, (20 pages).
U.S. Office action dated Feb. 26, 2013 for cross reference U.S. Appl. No. 12/794,093, (31 pages).
U.S. Notice of Allowance dated Mar. 18, 2013 for cross reference U.S. Appl. No. 12/795,001, (29 pages).
U.S. Office action dated Mar. 15, 2013 for cross reference U.S. Appl. No. 12/813,786, (33 pages).
U.S. Office action dated Mar. 19, 2013 for cross reference U.S. Appl. No. 13/194,759, (36 pages).
U.S. Office action dated Mar. 18, 2013 for cross reference U.S. Appl. No. 12/984,231, (29 pages).
U.S. Office action dated Mar. 22, 2013 for cross reference U.S. Appl. No. 12/987,569, (12 pages).
U.S. Office action dated May 7, 2013 for cross reference U.S. Appl. No. 12/820,270, (37 pages).
U.S. Office action dated Jun. 11, 2013 for cross reference U.S. Appl. No. 12/862,125, (37 pages).
U.S. Office action dated Jun. 26, 2013 for cross reference U.S. Appl. No. 12/794,093, (20 pages).
U.S. Office action dated Jul. 17, 2013, for cross reference U.S. Appl. No. 12/984,231, (18 pages).
U.S. Office action dated Aug. 13, 2013 for cross reference U.S. Appl. No. 13/194,759, (28 pages).
U.S. Office action dated Oct. 11, 2013 for cross reference U.S. Appl. No. 12/907,396, (44 pages).
U.S. Office action dated Oct. 21, 2013 for cross reference U.S. Appl. No. 12/987,569, (14 pages).
SIPO Certificate of Patent dated Aug. 14, 2013, for Chinese application 20100266406.6, (36 pages).
SIPO Office Action dated Oct. 9, 2012 for Chinese Application No. 201010266406.6.
U.S. Office Action dated Aug. 2, 2013 for U.S. Appl. No. 12/868,099.
U.S. Office action dated Jun. 17, 2013, for cross reference U.S. Appl. No. 13/180,454, (23 pages).
U.S. Office action dated May 22, 2013, for cross reference U.S. Appl. No. 13/219,427, (26 pages).
U.S. Office action dated Nov. 20, 2013, for cross reference U.S. Appl. No. 12/868,099, (14 pages).
U.S. Office action dated Nov. 4, 2013, for U.S. Appl. No. 13/219,427, (26 pages).
European Search Report dated May 13, 2011 for European Application No. 11250019.4 (6 pages).
European Search Report dated May 20, 2011 for European Application No. 10251404.9 (12 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Aug. 24, 2012, issued to KR 10-2010-0066993 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office action dated Aug. 1, 2011, issued to KR 10-2009-0074001 (3 pages).
KIPO Office Action dated Aug. 28,2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).

(56) References Cited

OTHER PUBLICATIONS

KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 29, 2013, issued to U.S. Appl. No. 12/820,355 (31 pages).
U.S. Office action dated Aug. 21, 2013 issued in cross-reference U.S. Appl. No. 12/820,355 (14 pages).
U.S. Office action dated Aug. 7, 2013, issued to U.S. Appl. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Mar. 17, 2014, for U.S. Appl. No. 12/950,361 (48 pages).
U.S. Office Action dated Mar. 23, 2012 for U.S. Appl. No. 12/849,193 (17 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Oct. 1, 2013, issued to U.S. Appl. No. 12/849,092, (13 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Patent Office Action dated May 16, 2013, issued to U.S. Appl. No. 13/235,337 (28 pages).
US Office action dated Sep. 12, 2012, in U.S. Appl. No. 12/515,673 (26 pages).

* cited by examiner

100
THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATION

This application claims the benefit of Korean Patent Application No. 10-2010-0031556, filed on Apr. 6, 2010, in the Korean Intellectual Property Office, the disclosure of which is incorporated herein by reference.

BACKGROUND

1. Field

Aspects of the present invention relate to a thin film deposition apparatus and a method of manufacturing an organic light-emitting display device by using the same, and more particularly, to a thin film deposition apparatus that can be easily used to manufacture large-sized display devices on a mass scale and that improves manufacturing yield, and a method of manufacturing an organic light-emitting display device by using the thin film deposition apparatus.

2. Description of the Related Art

Organic light-emitting display devices have a larger viewing angle, better contrast characteristics, and a faster response rate than other display devices, and thus have drawn attention as a next-generation display device.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

However, the deposition method using such an FMM is not suitable for manufacturing larger devices using a mother glass having a size of 5 G or greater. In other words, when such a large mask is used, the mask may bend due to self-gravity, thereby distorting a pattern. This is not conducive for the recent trend towards high-definition patterns.

SUMMARY

In order to address the drawback of the deposition method using a fine metal mask (FMM), an aspect of the present invention provides a thin film deposition apparatus that may be easily used to produce large-sized display devices on a mass scale and that may be suitable for high-definition patterning, and a method of manufacturing an organic light-emitting display device using the thin film deposition apparatus.

According to an aspect of the present invention, there is provided a thin film deposition apparatus including: a loading unit to accommodate a substrate, which is a deposition target, on an electrostatic chuck; a deposition unit including a chamber, and a thin film deposition assembly that is disposed in the chamber and forms a thin film on the substrate disposed on the electrostatic chuck; an unloading unit to separate the substrate on which deposition is completed from the electrostatic chuck; a first conveyor unit to sequentially move the electrostatic chuck having the substrate thereon to the loading unit, to the deposition unit, and finally, to the unloading unit, wherein the first conveyor unit includes: one pair of first guide rails and one pair of second guide rails disposed in parallel; at least one first guide block engaged with the first guide rails, respectively; and at least one second guide block engaged with the second guide rails, respectively.

The two pairs of first and second guide rails may be formed to pass through the chamber, the first guide rails are disposed on outer portions of the second guide rails, respectively, the at least one first guide block moves in a linear reciprocating manner along a pair of the first guide rails, and the at least one second guide block moves in a linear reciprocating manner along a pair of the second guide rails.

The electrostatic chuck having the substrate thereon may be disposed on the at least one first or second guide block, and the substrate may move in a linear reciprocating manner along the at least one first or second guide rail.

The at least one first guide block and the at least one second guide block may move in a linear reciprocating manner to be independent from each other.

The electrostatic chuck may include: a first electrostatic chuck disposed on the at least one first guide block; and a second electrostatic chuck disposed on the at least one second guide block.

A portion of the first electrostatic chuck facing the at least one second guide block may include a first groove, and a portion of the second electrostatic chuck facing the at least one first guide block may include a second groove.

The first electrostatic chuck may be separated from the at least one second guide block by a predetermined distance, and the second electrostatic chuck may be separated from the at least one first guide block by a predetermined distance.

The first guide rails and the second guide rails may be linear motion rails, and the at least one first guide block and the at least one second guide block may be linear motion blocks.

A plurality of thin film deposition assemblies may be disposed in the chamber.

According to another aspect of the present invention, the chamber may include: a first chamber in which a plurality of thin film deposition assemblies are disposed; and a second chamber in which a plurality of thin film deposition assemblies are disposed, wherein the first chamber is connected with the second chamber.

The thin film deposition assembly may include: a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits arranged in the first direction; and a barrier plate assembly including a plurality of barrier plates that are disposed between the deposition source nozzle unit and the patterning slit sheet in the first direction, and partition a space between the deposition source nozzle unit and the patterning slit sheet into a plurality of sub-deposition spaces, wherein the thin film deposition assembly is separated apart from the substrate, and the thin film deposition assembly or the substrate is moved relative to the other.

According to another aspect of the present invention, the patterning slit sheet of the thin film deposition apparatus may be smaller than the substrate.

The plurality of barrier plates may extend in a second direction substantially perpendicular to the first direction.

The plurality of barrier plates may be arranged at equal intervals.

According to another aspect of the present invention, the barrier plate assembly may include: a first barrier plate assembly including a plurality of first barrier plates; and a second barrier plate assembly including a plurality of second barrier plates.

The first barrier plates and the second barrier plates may extend in a second direction substantially perpendicular to the first direction.

The first barrier plates may be arranged to correspond to the second barrier plates, respectively.

Each pair of the corresponding first and second barrier plates may be arranged on substantially the same plane.

According to another aspect of the present invention, the thin film deposition assembly may include: a deposition source for discharging a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction perpendicular to the first direction, wherein deposition is performed while the substrate or the thin film deposition apparatus is moved relative to the other in the first direction, and the deposition source, the deposition source nozzle unit, and the patterning slit sheet are formed integrally with one another.

The deposition source and the deposition source nozzle unit may be connected to the patterning slit sheet by a connection member.

The connection member may guide movement of the discharged deposition material.

The connection member may seal a space between the deposition source, the deposition source nozzle unit, and the patterning slit sheet.

The thin film deposition apparatus may be separated from the substrate by a predetermined distance.

The deposition material discharged from the thin film deposition apparatus may be continuously deposited on the substrate while the substrate or the thin film deposition apparatus is moved relative to the other in the first direction.

The patterning slit sheet of the thin film deposition apparatus may be smaller than the substrate.

The plurality of deposition source nozzles may be tilted by a predetermined angle.

The plurality of deposition source nozzles may include deposition source nozzles arranged in two rows formed in the first direction, and the deposition source nozzles in the two rows are tilted to face each other.

The plurality of deposition source nozzles may include deposition source nozzles arranged in two rows formed in the first direction, the deposition source nozzles of a row located at a first side of the patterning slit sheet may be arranged to face a second side of the patterning slit sheet, and the deposition source nozzles of the other row located at the second side of the patterning slit sheet may be arranged to face the first side of the patterning slit sheet.

According to another aspect of the present invention, there is provided a method of manufacturing an organic light-emitting display device by using a thin film deposition apparatus that includes a loading unit for disposing a substrate, which is a deposition target, on an electrostatic chuck, a deposition unit including a thin film deposition assembly for forming a thin film on the substrate, and an unloading unit for separating the substrate on which deposition is completed from the electrostatic chuck, the method including: disposing the substrate on the electrostatic chuck by using the loading unit; disposing the electrostatic chuck having the substrate thereon either on a first guide block moving along a first guide rail or a second guide block moving along a second guide rail; depositing a deposition material discharged from the thin film deposition apparatus on the substrate while the substrate or the thin film deposition apparatus is moved relative to the other; separating the electrostatic chuck from the first or second guide block by using the unloading unit; and moving the first or second guide block separated from the electrostatic chuck along the first or second guide rail toward the loading unit.

The electrostatic chuck may include: a first electrostatic chuck disposed on the first guide block; and a second electrostatic chuck disposed on the second guide block.

A portion of the first electrostatic chuck facing the second guide block may include a first groove, and a portion of the second electrostatic chuck facing the first guide block may include a second groove.

The first electrostatic chuck may be separated from the second guide block by a predetermined distance, and the second electrostatic chuck may be separated from the first guide block by a predetermined distance.

The first guide rail and the second guide rail may be linear motion rails, and the first guide block and the second guide block may be linear motion blocks.

A plurality of thin film deposition assemblies may be disposed in the chamber.

The chamber may include first and second chambers each including a plurality of thin film deposition assemblies, and the first chamber and the second chamber may be connected to each other.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
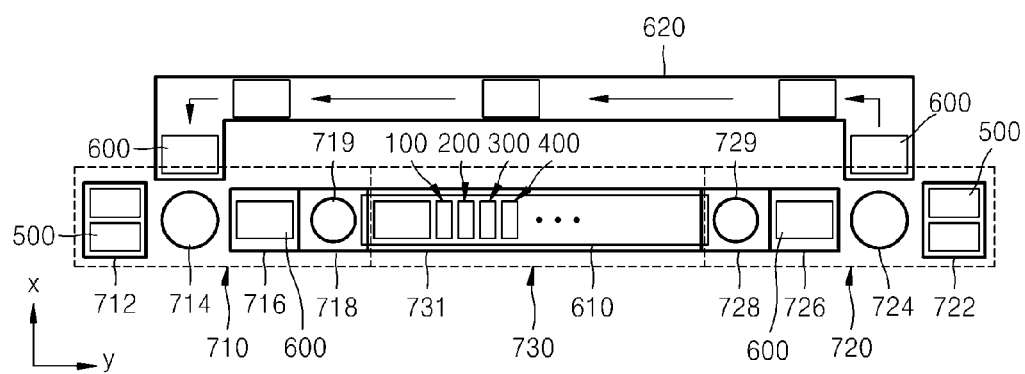
FIG. 1 is a schematic view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
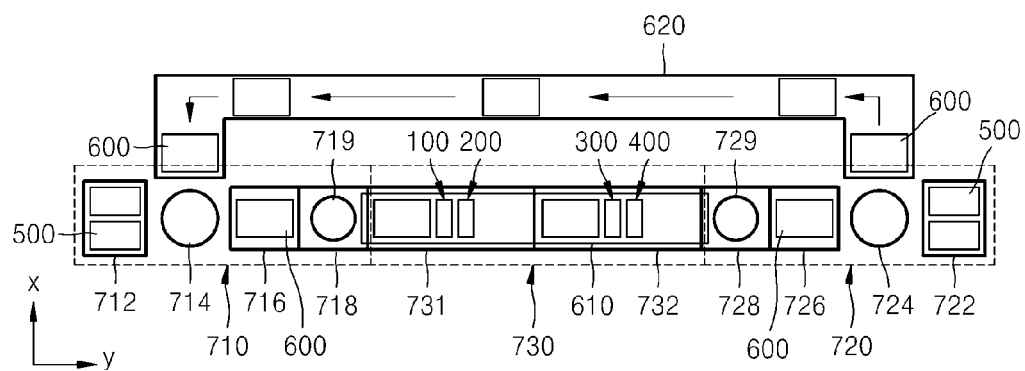
FIG. 2 is a schematic view of a modified example of the thin film deposition apparatus of FIG. 1.
Figure 3:
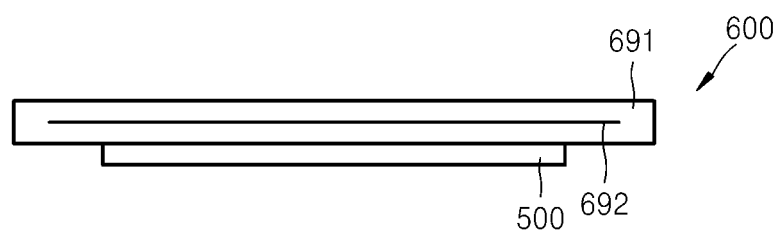
FIG. 3 is a cross-sectional view of an example of an electrostatic chuck of FIG. 1 according to an embodiment of the present invention.

FIG. 1 is a schematic perspective view of a thin film deposition apparatus according to an embodiment of the present invention. FIG. 2 illustrates a modified example of the thin film deposition apparatus of FIG. 1. FIG. 3 is a view of an example of an electrostatic chuck 600 according to an embodiment of the present invention.

Referring to FIG. 1, the thin film deposition apparatus includes a loading unit 710, a deposition unit 730, an unloading unit 720, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, disposes the substrate 500 on the electrostatic chuck 600 transferred by the second conveyer unit 620, and moves the electrostatic chuck 600 on which the substrate 500 is disposed into the transport chamber 716.

The first inversion chamber 718 is disposed adjacent to the transport chamber 716. The first inversion chamber 718 includes a first inversion robot 719 that inverts the electrostatic chuck 600 and then loads it into the first conveyer unit 610 of the deposition unit 730.

Referring to FIG. 3, the electrostatic chuck 600 may include an electrode 692 embedded in a main body 691 formed of ceramic, wherein the electrode 692 is supplied with power. The substrate 500 may be fixed to a surface of the main body 691 of the electrostatic chuck 600 as a high voltage is applied to the electrode 692.

Referring to FIG. 1, the transport robot 714 places one of the substrates 500 on the surface of the electrostatic chuck 600, and the electrostatic chuck 600 on which the substrate 500 is disposed is moved into the transport chamber 716. The first inversion robot 719 inverts the electrostatic chuck 600 so that the substrate 500 is turned upside down in the deposition unit 730.

The unloading unit 720 is constituted to operate in an opposite manner to the loading unit 710 described above. Specifically, a second inversion robot 729 in a second inversion chamber 728 inverts the electrostatic chuck 600, which has passed through the deposition unit 730 while the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 into the second rack 722. The electrostatic chuck 600 separated from the substrate 500 is returned back into the loading unit 710 via the second conveyer unit 620.

However, aspects of the present invention are not limited to the above description. For example, when disposing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. As illustrated in FIG. 1, the deposition unit 730 may include a first chamber 731. In this case, first to four thin film deposition assemblies 100, 200, 300, and 400 may be disposed in the first chamber 731. Although FIG. 1 illustrates that a total of four thin film deposition assemblies, i.e., the first to fourth thin film deposition assemblies 100 to 400, are installed in the first chamber 731, the total number of thin film deposition assemblies that may be installed in the first chamber 731 may vary according to a deposition material and deposition conditions. The first chamber 731 is maintained in a vacuum state during a deposition process.

In the thin film deposition apparatus illustrated in FIG. 2, a deposition unit 730 may include a first chamber 731 and a second chamber 732 that are connected to each other. In this case, first and second thin film deposition assemblies 100 and 200 may be disposed in the first chamber 731, and third and fourth thin film deposition assemblies 300 and 400 may be disposed in the second chamber 732. In this regard, additional chambers may be added.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyer unit 610. The electrostatic chuck 600 that is separated from the substrate 500 in the unloading unit 720 is moved back to the loading unit 710 by the second conveyer unit 620.

Figure 4:
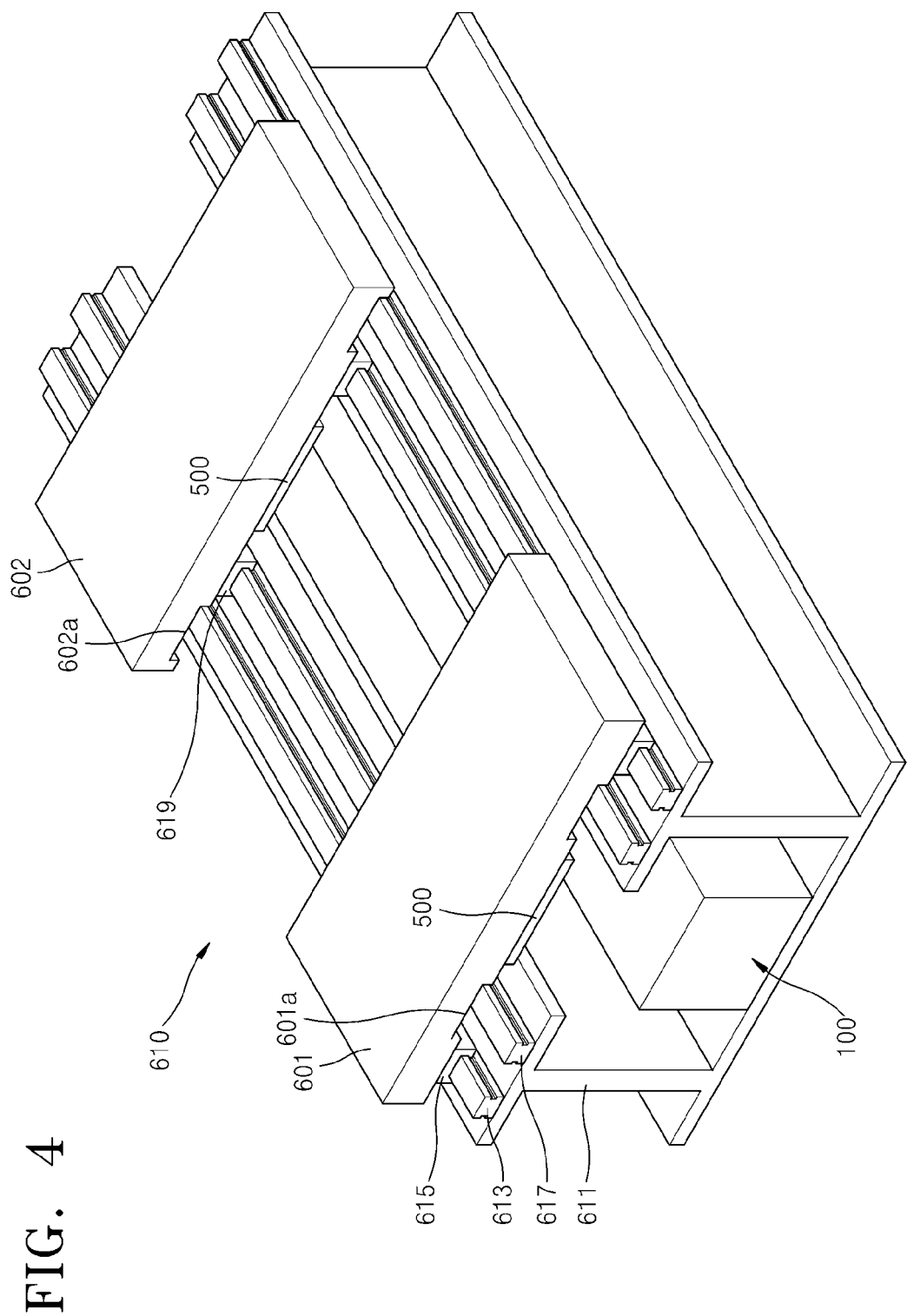
FIG. 4 is a schematic perspective view of a first conveyor unit included in the thin film deposition apparatus of FIG. 1, according to an embodiment of the present invention.

FIG. 4 is a schematic perspective view of the first conveyor unit 610 included in the thin film deposition apparatus of FIG. 1, according to an embodiment of the present invention. FIG.

Figure 6:
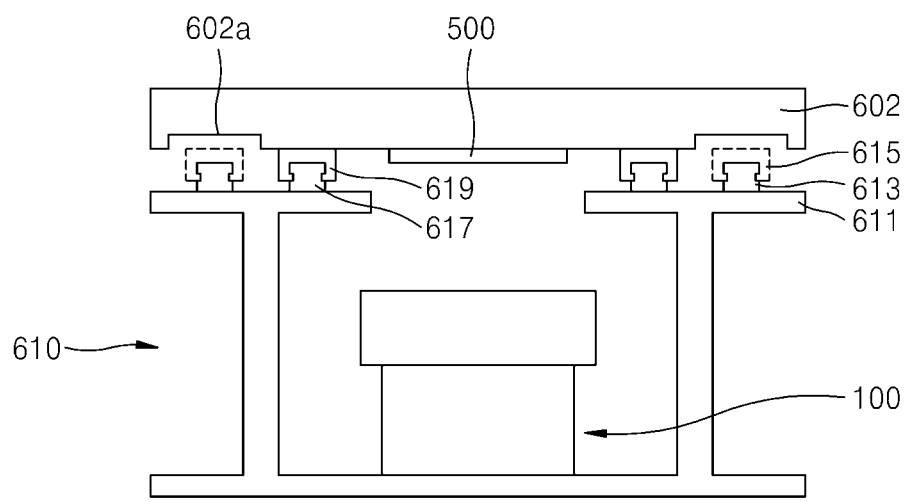
FIG. 6 is a plan view of a second electrostatic chuck and a second guide block included in the first conveyor unit of FIG. 4, according to an embodiment of the present invention.

5 is a plan view of a first electrostatic chuck 601 and a first guide block 615 included in the first conveyor unit 610 of FIG. 4, according to an embodiment of the present invention. FIG. 6 is a plan view of a second electrostatic chuck 602 and a second guide block 619 included in the first conveyor unit 610 of FIG. 4, according to an embodiment of the present invention.

Figure 5:
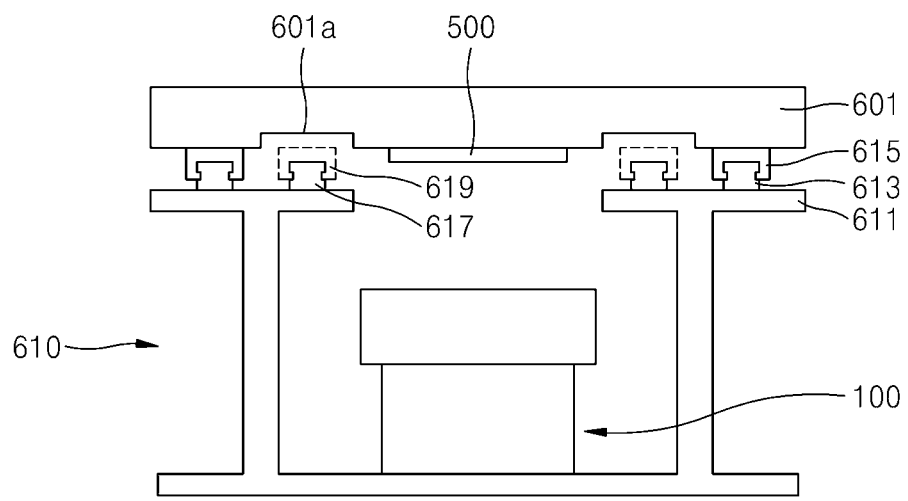
FIG. 5 is a plan view of a first electrostatic chuck and a first guide block included in the first conveyor unit of FIG. 4, according to an embodiment of the present invention.

Referring to FIGS. 4 to 6, the first conveyor unit 610 moves the first and second electrostatic chucks 601 and 602 each having one of substrates 500 thereon. The first conveyor unit 610 includes supports 611, two pairs of first and second guide rails 613 and 617 disposed on the supports 611, and a plurality of first and second guide blocks 615 and 619 disposed on the first rails 613 and the second guide rails 617, respectively. This will now be described in detail below.

As described above, according to an embodiment of the present invention, deposition is performed while an electrostatic chuck having a substrate thereon moves linearly within a chamber. In this case, a location of the substrate is difficult to precisely control when a roller or a conveyor belt is used as in a conventional method. Thus, for precise movement of the substrate, a linear motion (LM) system including guide rails and guide blocks may be used. However, in order to precisely move the substrate, that is, in order to guarantee precise linear movement of the substrate, a clearance between a guide rail and a guide block should be minimized. In order to minimize the clearance, the size of a ball bearing that may be disposed between a guide rail and a guide block may be increased or pre-pressure may be applied to the guide rail by elastically deforming the guide rail. However, in this case, the guide rail and the guide block are engaged in close contact with each other so as not to be separated from each other. Thus, deposition cannot be performed again while the guide block is returning back to the original position after deposition is performed, resulting in an increased manufacturing time and a lower yield.

To resolve this problem, a thin film deposition apparatus according to an embodiment of the present invention includes two pairs of guide rails and a plurality of guide blocks engaged with the guide rails, respectively. While deposition is performed on a substrate moving along one of the guide rails, a guide block is moved along another guide rail to return back to a loading unit. Accordingly, it is possible to not only precisely control the location of the substrate but also to perform deposition continuously without any pause.

In detail, the supports 611 and the two pairs of first and second guide rails 613 and 617 on the supports 611 are installed to pass through the first chamber 731 of the deposition unit 730.

Upper surfaces of the supports 611 are substantially planar, and the two pairs of first and second guide rails 613 and 617 are disposed on the upper surfaces of the supports 611, respectively. In detail, the first guide rails 613 are disposed on outer portions of the supports 611, and the second guide rails 617 are disposed on inner portions of the supports 611, respectively.

The first guide rails 613 are engaged with the first guide blocks 615, respectively, in such a manner that the first guide blocks 615 may move in a linear reciprocating manner along the first guide rails 613, respectively. The second guide rails 617 are engaged with the second guide blocks 619, respectively, in such a manner that the second guide blocks 619 may move in a linear reciprocating manner along the second guide rails 617, respectively.

Each of the first and second guide blocks 615 and 619 may include a driver (not shown). The drivers move the first guide blocks 615 and the second guide blocks 619 along the first guide rails 613 and the second guide rails 617, respectively, by applying a driving force onto the first guide blocks 615 and the second guide blocks 619. The driving force may be generated by the drivers or may be provided by a separate driving source (not shown).

The electrostatic chuck 600 of FIG. 1 includes the first electrostatic chuck 601 and the second electrostatic chuck 602.

Portions of a lower surface of the first electrostatic chuck 601 facing the second guide blocks 619 include a first groove 601a to prevent the first electrostatic chuck 601 and the second guide blocks 619 from contacting one another. That is, the first electrostatic chuck 601 contacts only the first guide blocks 615. Thus, when the first electrostatic chuck 601 on the first guide block 615 is moved along the first guide rails 613, a moving path of the first electrostatic chuck 601 is not disrupted by the second guide blocks 619.

Similarly, portions of a lower surface of the second electrostatic chuck 602 facing the first guide blocks 619 include a second groove 602a to prevent the second electrostatic chuck 602 and the first guide blocks 615 from contacting one another. That is, the second electrostatic chuck 602 contacts only the second guide blocks 619. Thus, when the second electrostatic chuck 602 on the second guide blocks 619 is moved along the second guide rails 617, a moving path of the second electrostatic chuck 602 is not disrupted by the first guide blocks 615.

Accordingly, the first guide blocks 615 may move in a linear reciprocating manner without being disrupted by the second electrostatic chuck 602, and at the same time, the second guide blocks 619 may also move in a linear reciprocating manner without being disrupted by the first electrostatic chuck 601.

A linear motion (LM) system may be fabricated by using the first and second guide rails 613 and 617 as linear motion (LM) rails and using the first and second guide blocks 615 and 619 as LM blocks. The LM system is a transfer system having a very high degree of positioning accuracy, in which it has a smaller friction coefficient than and generates less position errors than a conventional sliding guide system. The LM system is well know in the art and thus will not be described in detail.

Next, a conveyor mechanism for the first guide blocks 615 (having the first electrostatic chuck 601 thereon) and the second guide blocks 619 (having the second electrostatic chuck 602 thereon) will now be described.

FIGS. 7 to 10 illustrate a conveyor mechanism for guide blocks that may be included in the thin film deposition apparatus of FIG. 1, according to an embodiment of the present invention. In FIGS. 7 to 10, although not shown for convenience of explanation, it may be assumed that during an actual deposition process, a plurality of first electrostatic chucks, such as the first electrostatic chuck 601 of FIG. 4, are disposed on first guide blocks 615a, 615b, and 615c, and a plurality of second electrostatic chucks, such as the second electrostatic chuck 602 of FIG. 4, are disposed on second guide blocks 619a, 619b, and 619c, respectively.

Also, although three pairs of the first and second guide blocks 615a, 615b, and 615c, 619a, 619b, and 619c are illustrated in FIGS. 7 to 10, the aspects of the present invention are not limited thereto and the total number of guide blocks may vary according to the specifications of the thin film deposition apparatus. However, in order to reduce manufacturing time, the first guide blocks 615a, 615b, and 615c may be disposed adjacent to one another, and the second guide blocks 619a, 619b, and 619c may be disposed adjacent to one another. In other words, in order to reduce the manufacturing time, the first guide blocks 615a, 615b, and 615c and the second guide blocks 619a, 619b, and 619c are not alternately disposed but the first guide blocks 615a, 615b, and 615c may be disposed sequentially in a line and then the second guide blocks 619a, 619b, and 619c may be disposed sequentially in a line adjacent to the first guide blocks 615a, 615b, and 615c.

Figure 7:
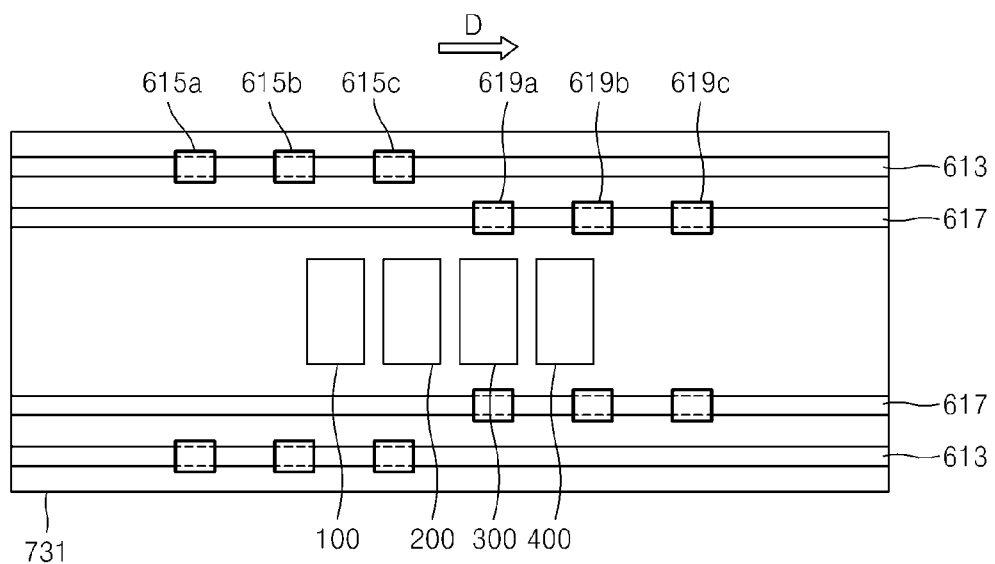
FIGS. 7 to 10 illustrate a conveyor mechanism for guide blocks that may be included in the thin film deposition apparatus of FIG. 1, according to an embodiment of the present invention.

First, referring to FIG. 7, the first guide blocks 615a, 615b, and 615c are moved along first guide rails 613 in a direction of arrow D, and at the same time, the second guide blocks 619a, 619b, and 619c are moved along second guide rails 617 in the direction of arrow D. At this time, deposition materials emitted from first to fourth thin film deposition assemblies 100, 200, 300, and 400 are deposited on a plurality of substrates, such as the substrate 500 of FIG. 4. That is, the first guide blocks 615a, 615b, and 615c are disposed on the first guide rails 613, the second guide blocks 619a, 619b, and 619c are disposed on the second guide rails 617, a plurality of first electrostatic chucks (not shown) are disposed on the first guide blocks 615a, 615b, and 615c, a plurality of second electrostatic chucks are disposed on the second guide blocks 619a, 619b, and 619c, and the substrates are disposed on the first and second electrostatic chucks, respectively.

Figure 8:
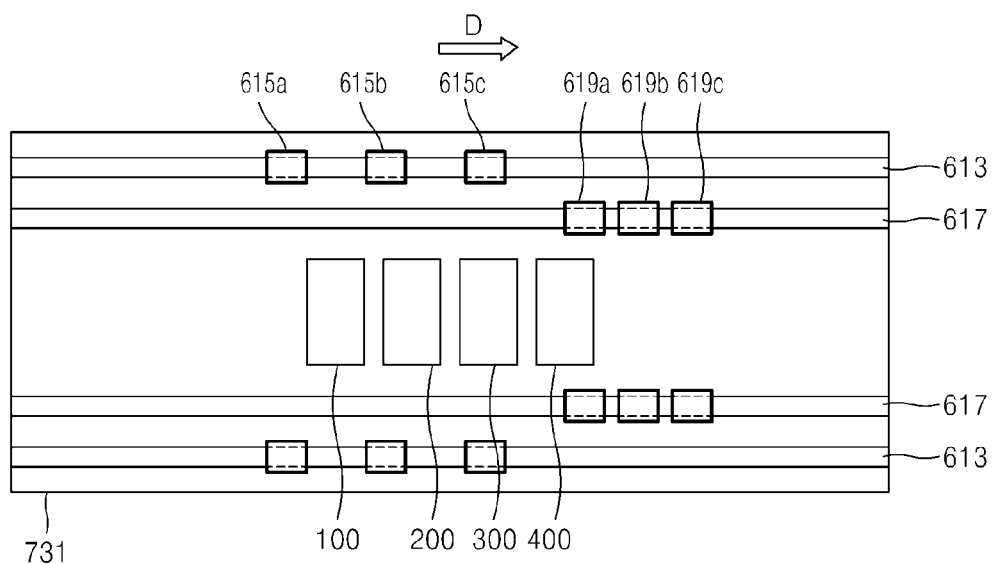

Next, referring to FIG. 8, the second guide blocks 619a, 619b, and 619c on which deposition has been completed while moving beside the first to fourth thin film deposition assemblies 100 to 400, are gathered together beside the fourth thin film deposition assembly 400. In this case, when the second electrostatic chucks disposed on the second guide blocks 619a, 619b, and 619c are past the first to fourth thin film deposition assemblies 100 to 400, they are separated from the second guide blocks 619a, 619b, and 619c via the unloading unit 720 of FIG. 1 and then are returned back to the loading unit 710 of FIG. 1 via the second conveyor unit 620 of FIG. 1.

Figure 9:
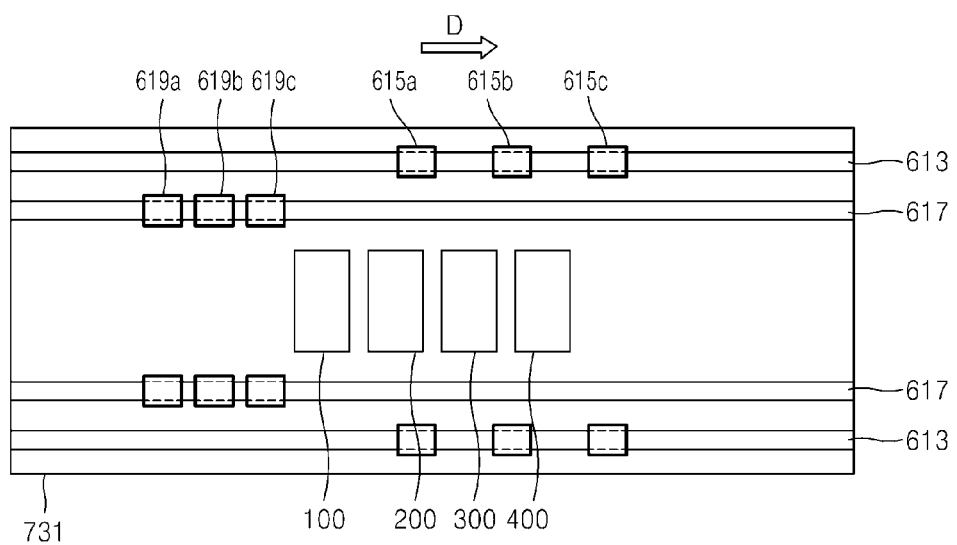

Next, referring to FIG. 9, the second guide blocks 619a, 619b, and 619c from which the second electrostatic chucks were separated, are moved in a direction opposite to the direction of arrow D and are returned back to the loading unit 710 so as to prepare for a next deposition process. Since each of the first electrostatic chucks has a first groove, such as the first groove 601a of FIG. 4, the second guide blocks 619a, 619b, and 619c may be moved in the direction opposite to the direction of arrow D without being disrupted.

Figure 10:
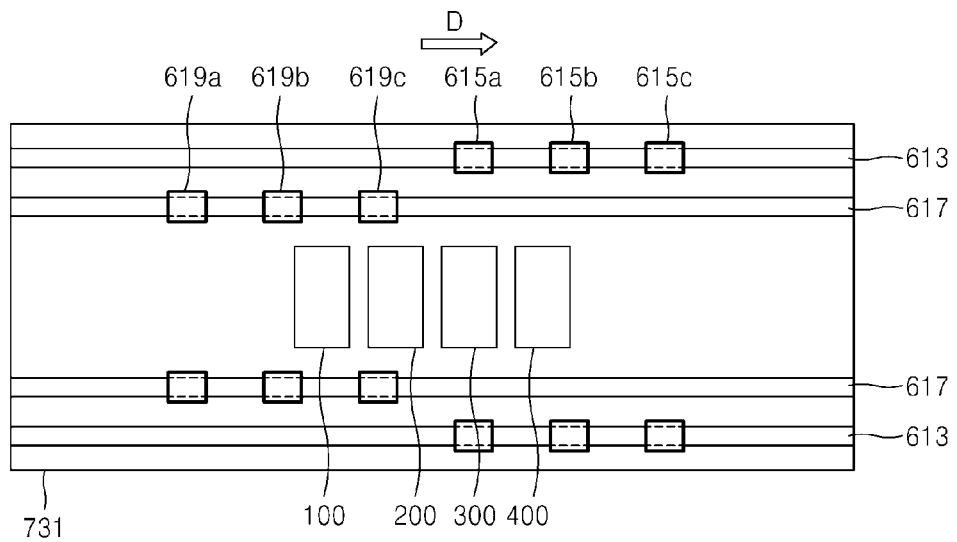

Next, referring to FIG. 10, the second electrostatic chucks having substrates, such as the substrate 500 of FIG. 1, thereon are loaded onto the second guide blocks 619a, 619b, and 619c returning back to the loading unit 710. Then deposition materials discharged from the first to fourth thin film deposition assemblies 100 to 400 are continuously deposited on the substrates while the second guide blocks 619a, 619b, and 619c are moved along the second guide rails 617 in the direction of arrow D.

Similarly, the first electrostatic chucks are separated from the first guide blocks 615a, 615b, and 615c on which deposition has been completed while the first guide blocks 615a, 615b, and 615c pass by the first to fourth thin film deposition assemblies 100 to 400. Then, the first guide blocks 615a, 615b, and 615c are moved in the direction opposite to the direction of arrow D and are returned back to the loading unit 710 so as to prepare for a next deposition process. Since each of the second electrostatic chucks has a second groove, such as the second groove 602a of FIG. 4, the first guide blocks 615a, 615b, and 615c may be moved in the direction opposite to the direction of arrow D without being disrupted.

As described above, according to an embodiment of the present invention, two pairs of guide rails and a plurality of guide blocks engaged with the guide rails are employed.

Thus, while deposition is performed on a substrate moving along one of the guide rails, a guide block may be moved along another guide rail to return back to a loading unit, thereby improving the precision of positioning the substrate and performing deposition continuously without any pause.

Figure 11:
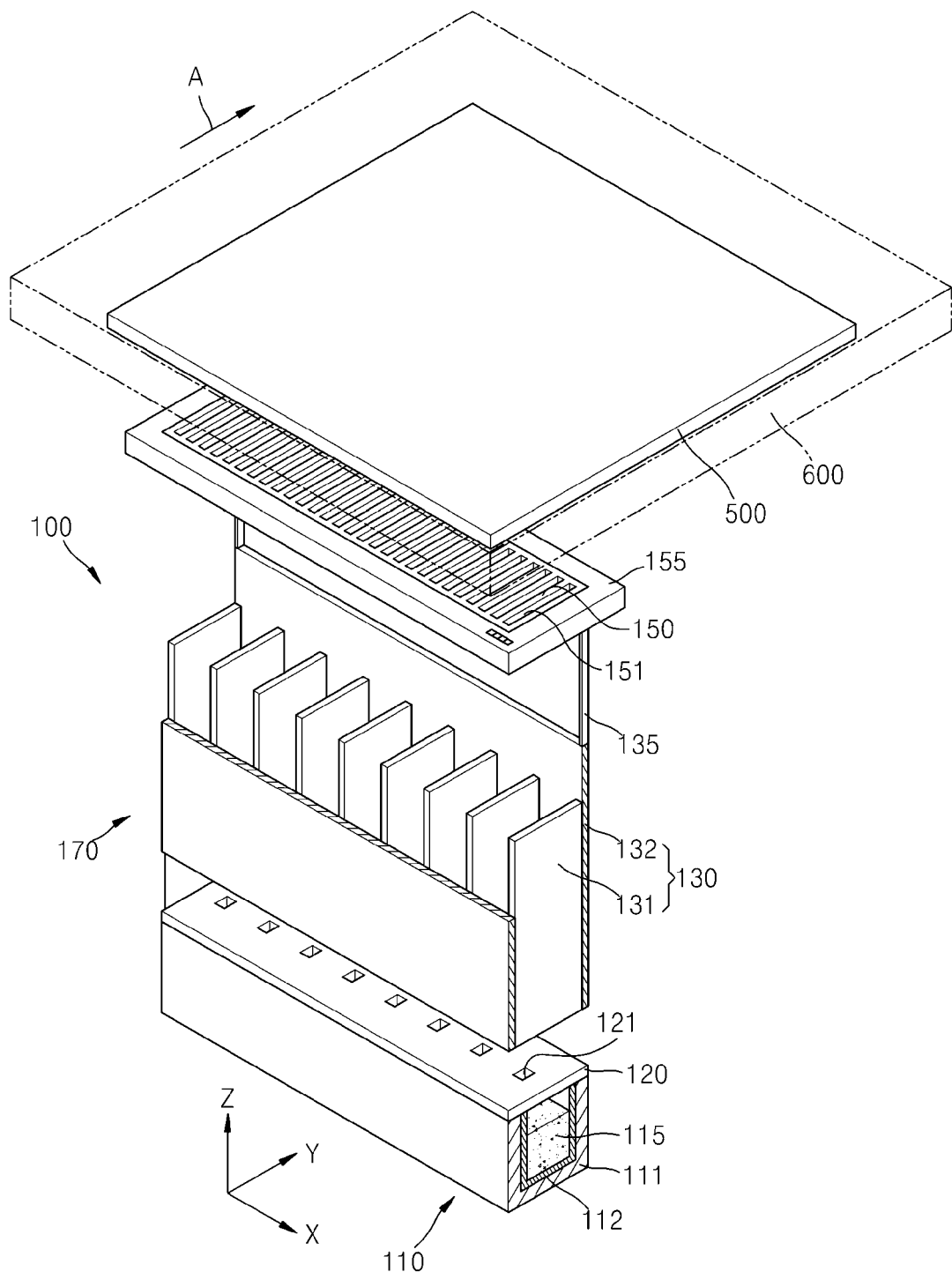
FIG. 11 is a schematic perspective view of a thin film deposition assembly of the thin film deposition apparatus of FIG. 1, according to an embodiment of the present invention.
Figure 12:
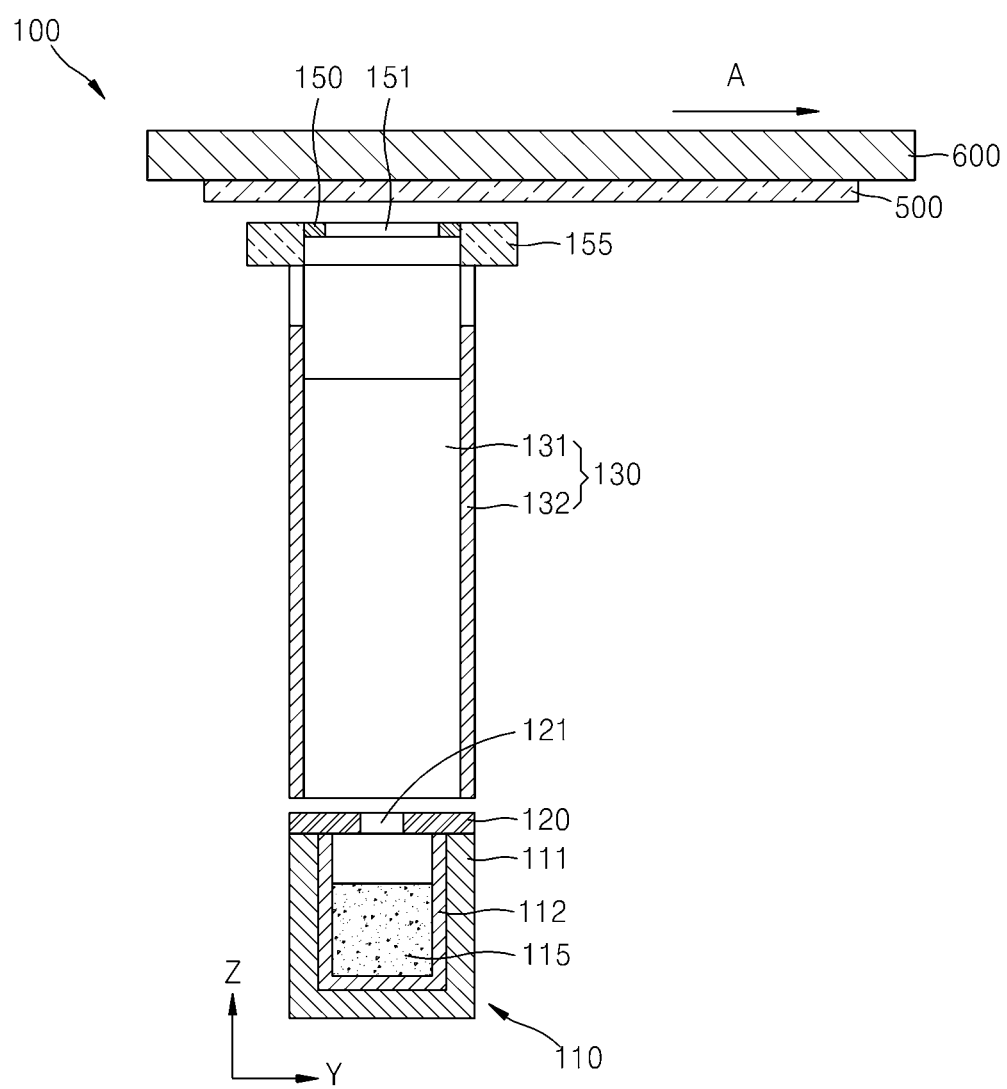
FIG. 12 is a schematic sectional side view of the thin film deposition assembly of FIG. 11, according to an embodiment of the present invention.
Figure 13:
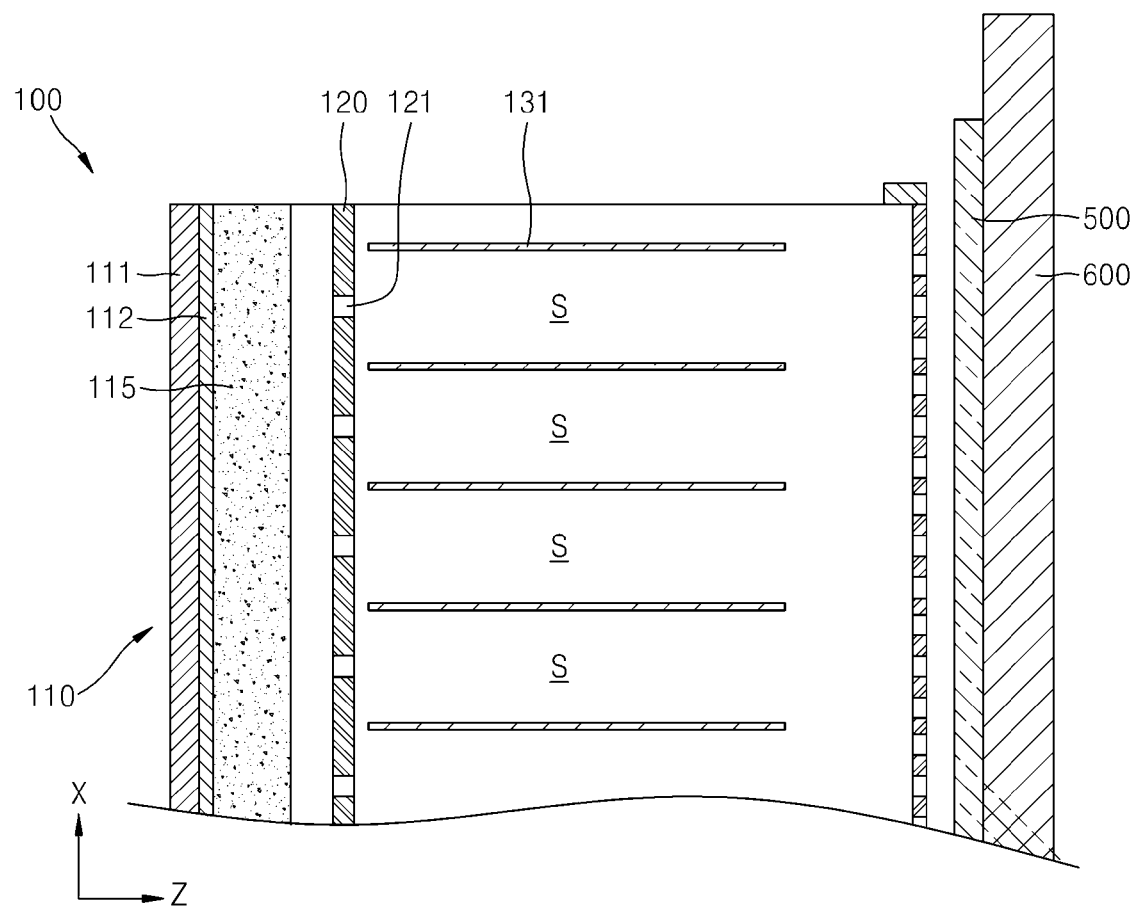
FIG. 13 is a schematic plan view of the thin film deposition assembly of FIG. 11, according to an embodiment of the present invention.

The thin film deposition assembly 100 of the thin film deposition apparatus described above according to an embodiment of the present invention will now be described. FIG. 11 is a schematic perspective view of the thin film deposition assembly 100 of the thin film deposition apparatus of FIG. 1, according to an embodiment of the present invention. FIG. 12 is a cross-sectional side view of the thin film deposition assembly 100 illustrated in FIG. 11. FIG. 13 is a cross-sectional plan view of the thin film deposition assembly 100 illustrated in FIG. 11.

Referring to FIGS. 11 through 13, the thin film deposition assembly 100 includes a deposition source 110, a deposition source nozzle unit 120, a barrier plate assembly 130, and patterning slits 151.

Although not illustrated in FIGS. 11 through 13 for convenience of explanation, all the components of the thin film deposition apparatus 100 may be disposed within a chamber that is maintained at an appropriate degree of vacuum. The chamber is maintained at an appropriate vacuum in order to allow a deposition material 115 to move in a substantially straight line through the thin film deposition apparatus 100.

In the thin film deposition apparatus, in order to deposit the deposition material 115 that has been discharged from the deposition source 110 and passed through the deposition source nozzle unit 120 and the patterning slits 151, onto a substrate 500 in a desired pattern, the chamber should be maintained in a high-vacuum state. In addition, the temperatures of a barrier plate assembly 130 and a patterning slit sheet 150 should be sufficiently lower than the temperature of the deposition source 110 to maintain a space between the deposition source nozzle unit 110 and the patterning slit sheet 150 in a high-vacuum state. In this regard, the temperatures of the barrier plate assembly 130 and the patterning slit sheet 150 may be about 100° C. or less. This is so the deposition material 115 that has collided with the barrier plate assembly 130 is not re-vaporized. In addition, thermal expansion of the patterning slit sheet 150 may be minimized when the temperature of the patterning slit sheet 150 is sufficiently low. The barrier plate assembly 130 faces the deposition source 110 which is at a high temperature. In addition, the temperature of a portion of the barrier plate assembly 130 close to the deposition source 110 rises by a maximum of about 167° C., and thus a partial-cooling apparatus (not shown) may be further included if needed.

In the chamber, the substrate 500 that is a deposition target is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In an embodiment, the substrate 500 or the thin film deposition assembly 100 may be moved relative to the other. For example, as illustrated in FIG. 11, the substrate 500 may be moved in a direction of an arrow A, relative to the thin film deposition assembly 100.

In a conventional deposition method using a fine metal mask (FMM), the size of the FMM has to be greater than or equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition assembly 100 according to an embodiment of the present invention, deposition may be performed while the thin film deposition assembly 100 or the substrate 500 is moved relative to the other. In other words, deposition may be continuously performed while the substrate 500, which is disposed so as to face the thin film deposition assembly 100, is moved in a Y-axis direction. That is, deposition is performed in a scanning manner while the substrate 500 is moved in the direction of arrow A in FIG. 11. Although the substrate 500 is illustrated as being moved in the Y-axis direction when deposition is performed, the aspects of the present invention are not limited thereto and deposition may be performed while the thin film deposition assembly 100 is moved in the Y-axis direction, while the substrate 500 is fixed.

Thus, in the thin film deposition assembly 100 according to an embodiment of the present invention, the patterning slit sheet 150 may be significantly smaller than an FMM used in a conventional deposition method. In other words, in the thin film deposition assembly 100, deposition is continuously performed, i.e., in a scanning manner while the substrate 500 is moved in the Y-axis direction. Thus, a length of the patterning slit sheet 150 in the Y-axis direction may be significantly less than a length of the substrate 500 provided a width of the patterning slit sheet 150 in an X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in the scanning manner while the substrate 500 or the thin film deposition assembly 100 is moved relative to the other.

As described above, since the patterning slit sheet 150 may be formed to be significantly smaller than an FMM used in the conventional deposition method, it is relatively easy to manufacture the patterning slit sheet 150 used in the aspects of the present invention. In other words, using the patterning slit sheet 150, which is smaller than an FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

In order to perform deposition while the thin film deposition assembly 100 or the substrate 500 is moved relative to the other as described above, the thin film deposition assembly 100 and the substrate 500 may be separated from each other by a predetermined distance. This will be described later in detail.

The deposition source 110 that contains and heats the deposition material 115 is disposed in an opposite side of the chamber to a side in which the substrate 500 is disposed.

The deposition source 110 includes a crucible 112 that is filled with the deposition material 115, and a cooling block 111 surrounding the crucible 112. The cooling block 111 prevents radiation of heat from the crucible 112 outside, i.e., into the chamber. The cooling block 111 may include a heater (not shown) that heats the crucible 111.

The deposition source nozzle unit 120 is disposed at a side of the deposition source 110, and in particular, at the side of the deposition source 110 facing the substrate 500. The deposition source nozzle unit 120 includes a plurality of deposition source nozzle unit 120 that may be arranged at equal intervals in the X-axis direction. The deposition material 115 that is vaporized in the deposition source 110 passes through the deposition source nozzles 121 of the deposition source nozzle unit 120 towards the substrate 500 that is a deposition target.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to an YZ plane in FIG. 11, and may have a rectangular shape. The plurality of barrier plates 131 arranged as described above partition a deposition space between the deposition source nozzle unit 120 and the patterning slit sheet 150 into a plurality of sub-deposition spaces S (see FIG. 13). In the thin film deposition assembly 100 according to an embodiment of the present invention, as illustrated in FIG. 13, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the aspects of the present invention are not limited to this structure and a plurality of deposition source nozzles 121 may be disposed between two adjacent barrier plates 131. In this case, the deposition source nozzles 121 may be also respectively located at the midpoint between two adjacent barrier plates 131.

As described above, since the barrier plates 131 partition the deposition space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through the patterning slits 151 so as to be deposited on the substrate 500. In other words, the barrier plates 131 guide the deposition material 115, which is discharged through the deposition source nozzles slits 121, to move straight, not to flow in the X-axis direction.

As described above, the deposition material 115 is forced to move straight by installing the barrier plates 131, so that a smaller shadow zone may be formed on the substrate 500 compared to a case where no barrier plates are installed. Thus, the thin film deposition assembly 100 and the substrate 500 can be separated from each other by a predetermined distance. This will be described later in detail.

The barrier plate frame 132, which covers sides of the barrier plates 131, maintains the positions of the barrier plates 131, and guides the deposition material 115, which is discharged through the deposition source nozzles 121, not to flow in the Y-axis direction.

The deposition source nozzle unit 120 and the barrier plate assembly 130 may be separated from each other by a predetermined distance. This may prevent heat radiated from the deposition source unit 110 from being conducted to the barrier plate assembly 130. However, aspects of the present invention are not limited to this. For example, an appropriate heat insulator (not shown) may be further disposed between the deposition source nozzle unit 120 and the barrier plate assembly 130. In this case, the deposition source nozzle unit 120 and the barrier plate assembly 130 may be bound together with the heat insulator therebetween.

The barrier plate assembly 130 may be constructed to be detachable from the thin film deposition assembly 100. In the thin film deposition assembly 100 of the thin film deposition apparatus according to an embodiment of the present invention, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the thin film deposition assembly 100, when a large amount of the deposition material 115 lies in the barrier plate assembly 130 after a long deposition process, the barrier plate assembly 130 may be detached from the thin film deposition assembly 100 and then placed in a separate deposition material recycling apparatus in order to recover the deposition material 115. Therefore, due to the structure of the thin film deposition assembly 100 according to an embodiment of the present invention, a reuse rate of the deposition material 115 is increased, so that the deposition efficiency is improved, and thus the manufacturing costs are reduced.

The patterning slit sheet 150 and a frame 155 are disposed between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The patterning slits 151 extend in the Y-axis direction. The deposition material 115 that has been vaporized in the deposition source 110 and passed through the deposition source nozzle 121, passes through the patterning slits 151 towards the substrate 500.

The patterning slit sheet 150 may be formed of a metal thin film, and may be fixed to the frame 150 such that a tensile force is exerted thereon. The patterning slits 151 may be formed by etching the patterning slit sheet 150 to a stripe pattern.

In the thin film deposition assembly 100 according to an embodiment of the present invention, the total number of patterning slits 151 may be greater than the total number of deposition source nozzles 121. In addition, there may be a greater number of patterning slits 151 than deposition source nozzles 121 disposed between two adjacent barrier plates 131. The number of patterning slits 151 may be equal to the number of deposition patterns to be formed on the substrate 500.

The barrier plate assembly 130 and the patterning slit sheet 150 may be disposed to be separated from each other by a predetermined distance. Alternatively, the barrier plate assembly 130 and the patterning slit sheet 150 may be connected by a connection member 135. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other by the predetermined distance.

As described above, the thin film deposition assembly 100 according to an embodiment of the present invention performs deposition while being moved relative to the substrate 500. In order to move the thin film deposition assembly 100 relative to the substrate 500, the patterning slit sheet 150 is separated from the substrate 500 by the predetermined distance. In addition, in order to prevent the formation of a relatively large shadow zone on the substrate 500 when the patterning slit sheet 150 and the substrate 500 are separated from each other, the barrier plates 131 are arranged between the deposition source nozzle unit 120 and the patterning slit sheet 150 to force the deposition material 115 to move in a straight direction. Thus, the size of the shadow zone that may be formed on the substrate 500 is sharply reduced.

In a conventional deposition method using an FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 100, the patterning slit sheet 150 is disposed to be separated from the substrate 500 by the predetermined distance. This may be facilitated by installing the barrier plates 131 to reduce the size of the shadow zone formed on the substrate 500.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the conventional deposition method. In addition, since the substrate 500 and the patterning slit sheet 150 are separated from each other, defects caused due to contact theretween may be prevented. In addition, since it is unnecessary to contact the substrate 500 with the patterning slit sheet 150 during deposition, the manufacturing speed may be improved.

Figure 14:
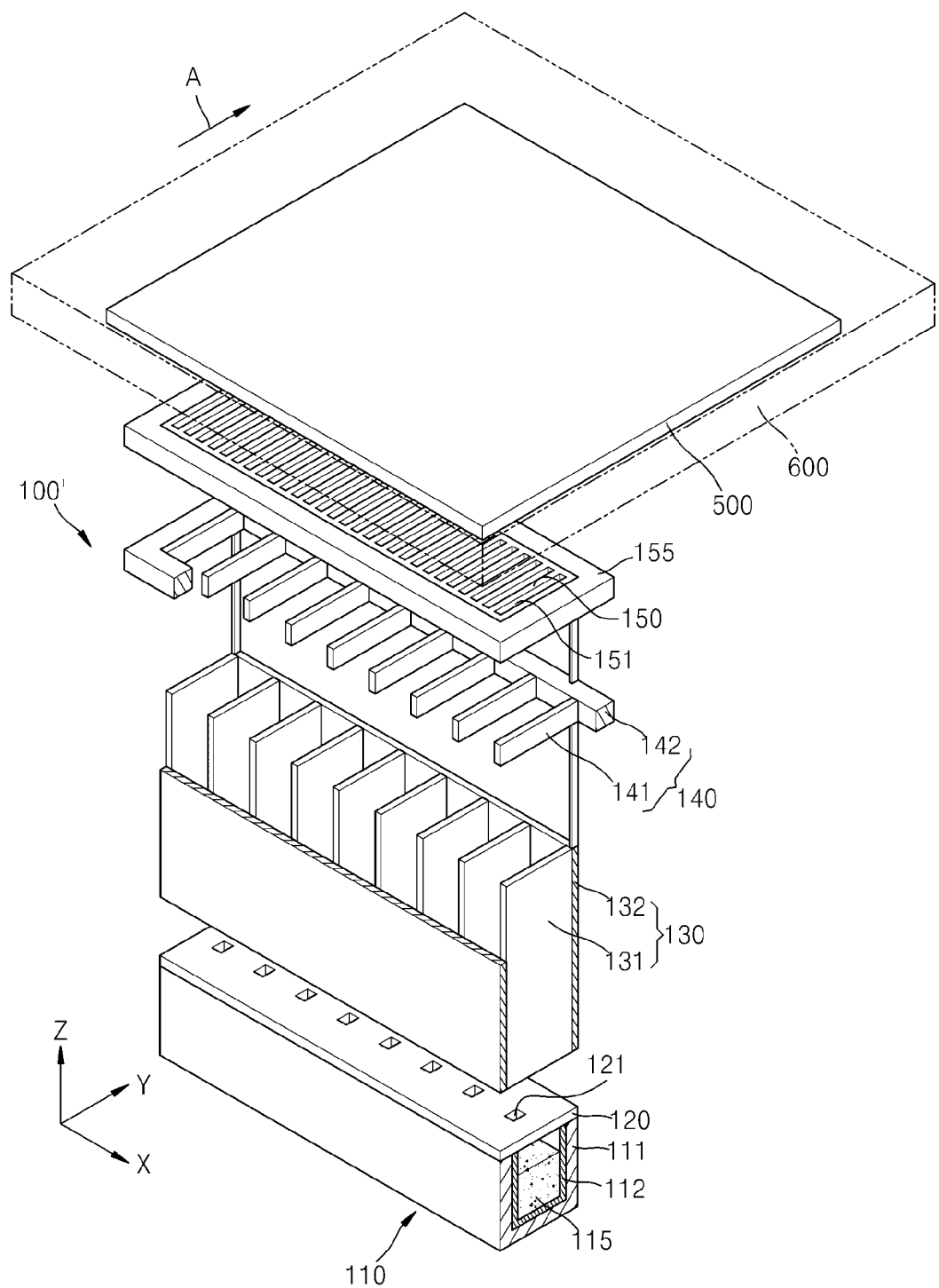
FIG. 14 is a schematic perspective view of a thin film deposition assembly according to another embodiment of the present invention.

FIG. 14 is a schematic perspective view of a thin film deposition assembly 100' according to another embodiment of the present invention. Referring to FIG. 14, the thin film deposition assembly 100' includes a deposition source 110, a deposition source nozzle unit 120, a first barrier plate assembly 130, a second barrier plate assembly 140, and a patterning slit sheet 150.

Although not illustrated in FIG. 14 for convenience of explanation, all the components of the thin film deposition assembly 100' may be disposed within a chamber that is maintained at an appropriate degree of vacuum. The chamber is maintained at an appropriate vacuum in order to allow a deposition material 115 to move in a substantially straight line through the thin film deposition apparatus 100.

A substrate 500 that is a deposition target is disposed in the chamber. The deposition source 110 that contains and heats the deposition material 115 is disposed in an opposite side of the chamber to a side in which the substrate 500 is disposed.

Structures of the deposition source 110 and the patterning slit sheet 150 are the same as those in the embodiment described with reference to FIG. 11, and thus a detailed description thereof will not be provided here. The first barrier plate assembly 130 is also the same as the barrier plate assembly 130 of the embodiment described with reference to FIG. 11, and thus a detailed description thereof will not be provided here.

The second barrier plate assembly 140 is disposed at a side of the first barrier plate assembly 130. The second barrier plate assembly 140 includes a plurality of second barrier plates 141, and a second barrier plate frame 141 that covers sides of the second barrier plates 142.

The plurality of second barrier plates 141 may be arranged parallel to each other at equal intervals in the X-axis direction. In addition, each of the second barrier plates 141 may be formed to extend over an YZ plane in FIG. 14, i.e., perpendicular to the X-axis direction.

The plurality of first barrier plates 131 and second barrier plates 141 arranged as described above partition a deposition space between the deposition source nozzle unit 120 and the patterning slit sheet 150 into a plurality of sub-deposition spaces. That is, the deposition space is divided by the first barrier plates 131 and the second barrier plates 141 into a plurality of sub-deposition spaces that respectively correspond to the deposition source nozzles 121 through which the deposition material 115 is discharged.

The second barrier plates 141 may be disposed to correspond to the first barrier plates 131, respectively. In other words, the second barrier plates 141 may be directly aligned with the first barrier plates 131, respectively. Each pair of the corresponding first and second barrier plates 131 and 141 may be located on the same plane. Although the first barrier plates 131 and the second barrier plates 141 are respectively illustrated as having the same thickness in the X-axis direction, aspects of the present invention are not limited thereto. In other words, the second barrier plates 141, which need to be accurately aligned with the patterning slits 151, may be formed to be relatively thin, whereas the first barrier plates 131, which do not need to be precisely aligned with the patterning slits 151, may be formed to be relatively thick. This makes it easier to manufacture the thin film deposition assembly 100'.

A plurality of the thin film deposition assemblies 100 or 100' described above may be successively disposed in the first chamber 731 of FIG. 1. Referring to FIG. 1, the thin film deposition assemblies 100, 200, 300 and 400 may be used to deposit different deposition materials, respectively. In this case, the thin film deposition assemblies 100, 200, 300 and 400 may have different patterning slit patterns, so that pixels of different colors, for example, red, green and blue, may be simultaneously defined through a film deposition process.

Figure 15:
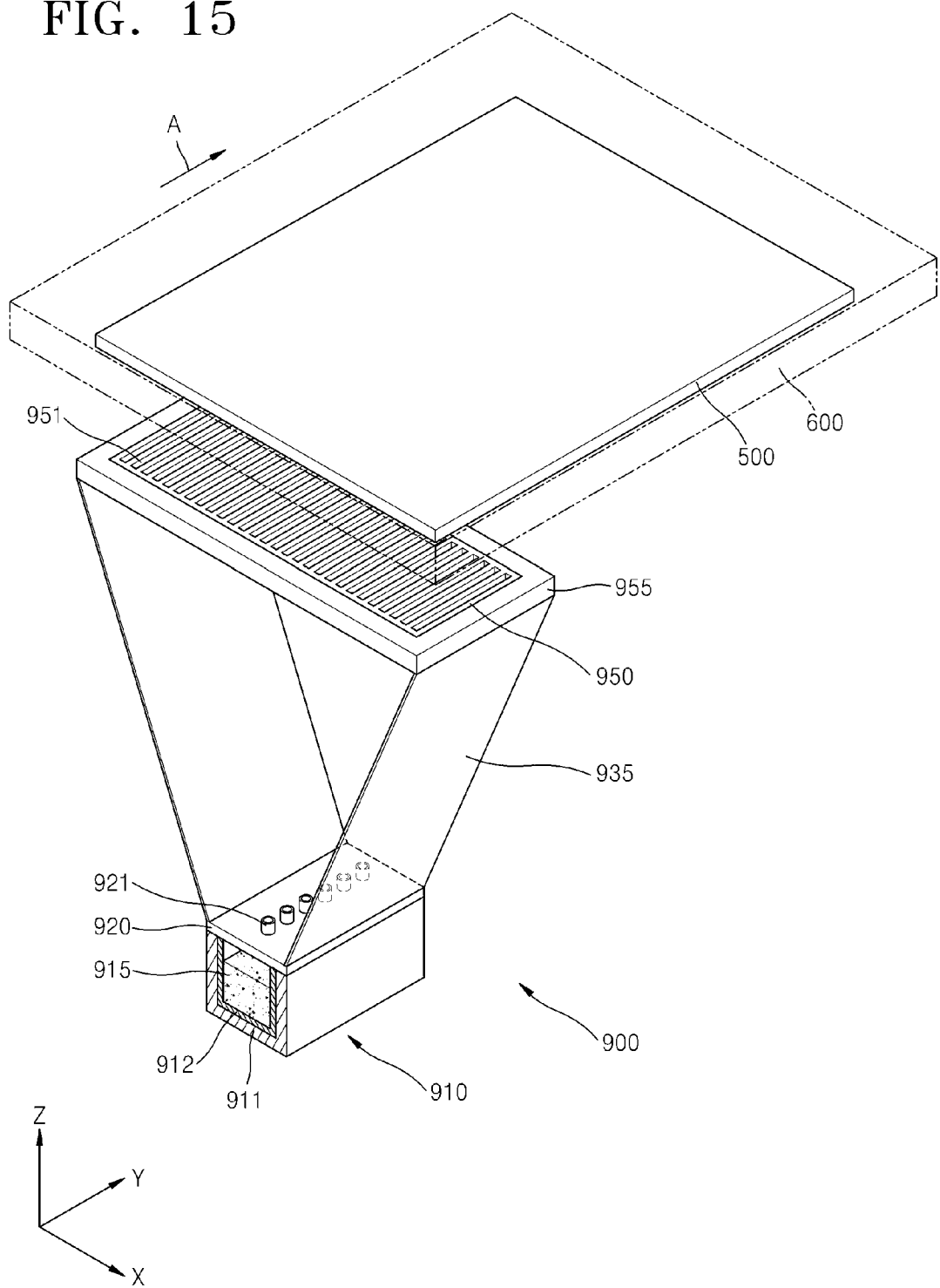
FIG. 15 is a schematic perspective view of a thin film deposition assembly according to another embodiment of the present invention.
Figure 16:
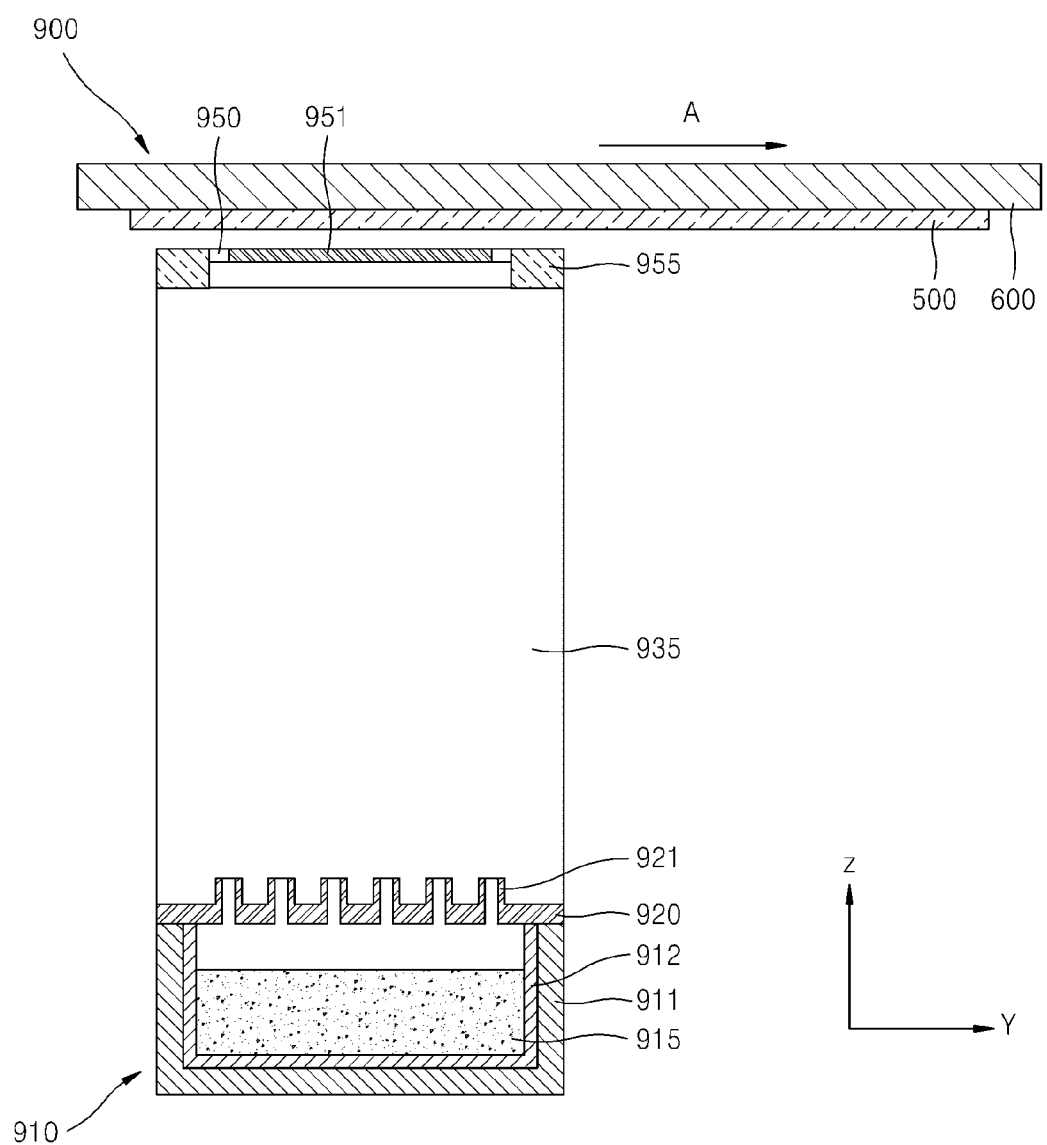
FIG. 16 is a schematic plan view of the thin film deposition assembly of FIG. 15, according to an embodiment of the present invention.
Figure 17:
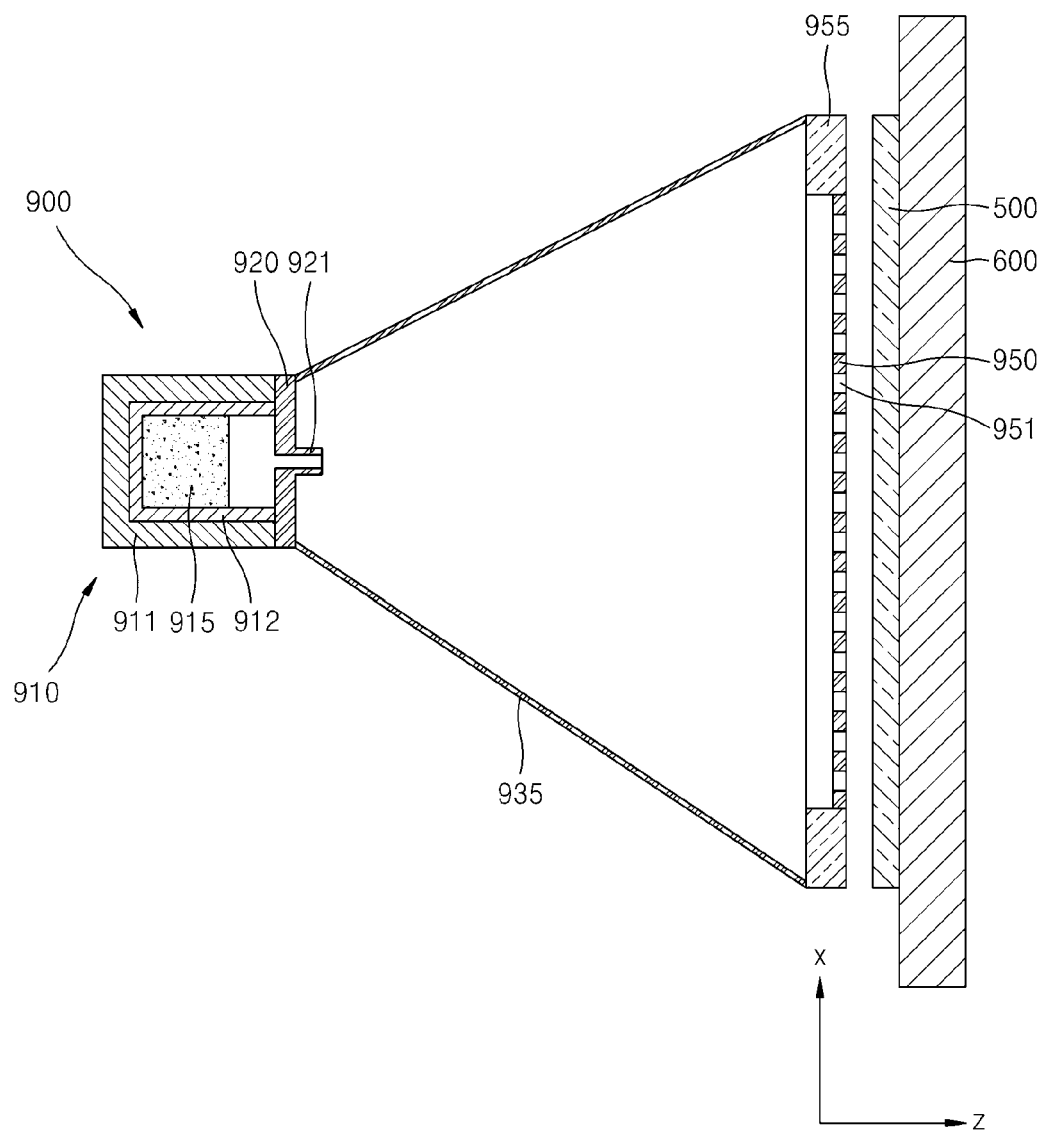
FIG. 17 is a schematic plan view of the thin film deposition assembly of FIG. 15, according to an embodiment of the present invention.

FIG. 15 is a schematic perspective view of a thin film deposition assembly 900 according to another embodiment of the present invention. FIG. 16 is a schematic sectional view of the thin film deposition assembly 900 illustrated in FIG. 15. FIG. 17 is a schematic plan view of the thin film deposition assembly 900 illustrated in FIG. 15.

Referring to FIGS. 15 to 17, the thin film deposition assembly 900 includes a deposition source 910, a deposition source nozzle unit 920, and a patterning slit sheet 950.

Although not illustrated in FIGS. 15 to 17 for convenience of explanation, all the components of the thin film deposition apparatus 900 may be disposed within a chamber that is maintained at an appropriate degree of vacuum. The chamber is maintained at an appropriate vacuum in order to allow a deposition material 915 to move in a substantially straight line through the thin film deposition apparatus 900.

A substrate 500 that is a deposition target is moved by an electrostatic chuck 600 in the chamber. The substrate 500 may be a substrate for flat panel displays. A large substrate, such as a mother glass, for manufacturing a plurality of flat panel displays, may be used as the substrate 500. Other substrates may also be employed.

Deposition may be performed while the substrate 500 or the thin film deposition assembly 900 is moved relative to the other. In particular, deposition may be continuously performed while the substrate 500, which is disposed so as to face the thin film deposition assembly 900, is moved in a Y-axis direction. In other words, deposition is performed in a scanning manner while the substrate 500 is moved in a direction of arrow A in FIG. 15. Although the substrate 500 is illustrated as being moved in the Y-axis direction within the chamber in FIG. 15 when deposition is performed, the aspects of the present invention are not limited thereto. Deposition may be performed while the thin film deposition assembly 900 is moved in the Y-axis direction, whereas the substrate 500 is fixed.

Thus, in the thin film deposition assembly 900, the patterning slit sheet 950 may be significantly smaller than an FMM used in a conventional deposition method. In other words, in the thin film deposition assembly 900, deposition is continuously performed, i.e., in a scanning manner, while the substrate 500 is moved in the Y-axis direction. Thus, lengths of the patterning slit sheet 950 in the X-axis and Y-axis directions may be significantly less than the lengths of the substrate 500 in the X-axis and Y-axis directions. As described above, since the patterning slit sheet 950 may be formed to be significantly smaller than an FMM used in a conventional deposition method, it is relatively easy to manufacture the patterning slit sheet 950. In other words, using the patterning slit sheet 950, which is smaller than an FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

In order to perform deposition while the thin film deposition assembly 900 or the substrate 500 is moved relative to the other as described above, the thin film deposition assembly 900 and the substrate 500 may be separated from each other by a predetermined distance. This will be described later in detail.

The deposition source 910 that contains and heats the deposition material 915 is disposed in an opposite side of the chamber to a side in which the substrate 500 is disposed. While being vaporized in the deposition source 910, the deposition material 915 is deposited on the substrate 500.

In particular, the deposition source 910 includes a crucible 911 that is filled with the deposition material 915, and a heater 911 that heats the crucible 911 to vaporize the deposition material 915, which is contained in the crucible 911, towards a side of the crucible 911, and in particular, towards the deposition source nozzle unit 920.

The deposition source nozzle unit 920 is disposed at a side of the deposition source 910, and in particular, at the side of the deposition source 910 facing the substrate 500. The deposition source nozzle unit 920 includes a plurality of deposition source nozzles 921 that may be arranged at equal intervals in the X-axis direction. The deposition material 915 that is vaporized in the deposition source 910, passes through the deposition source nozzle unit 920 towards the substrate 500. As described above, when the deposition source nozzle unit 920 includes the plurality of deposition source nozzles 921 arranged in the Y-axis direction, that is, the scanning direction of the substrate 500, the size of a pattern formed of the deposition material 915 discharged through the patterning slits 950 of the patterning slit sheet 951 is affected by the size of one of the deposition source nozzles 921 (since there is only one line of deposition nozzles in the X-axis direction), thereby preventing a shadow zone from being formed on the substrate 500. In addition, since the plurality of deposition source nozzles 921 are arranged in the scanning direction of the substrate 500, even if there is a difference between fluxes of the deposition source nozzles 121, the difference may be compensated for and deposition uniformity may be maintained constantly.

The patterning slit sheet 950 and a frame 155 are disposed between the deposition source 910 and the substrate 500. The frame 955 may be formed in a lattice shape, similar to a window frame. The patterning slit sheet 950 is bound inside the frame 155. The patterning slit sheet 950 includes a plurality of patterning slits 951 arranged in the X-axis direction. The deposition material 915 that is vaporized in the deposition source 910, passes through the deposition source nozzle unit 920 and the patterning slit sheet 950 towards the substrate 500. The patterning slit sheet 950 may be manufactured by etching, which is the same method as used in a conventional method of manufacturing an FMM, and in particular, a striped FMM. In this regard, the total number of patterning slits 951 may be greater than the total number of deposition source nozzles 921.

In addition, the deposition source 910 and the deposition source nozzle unit 920 coupled to the deposition source 910 may be disposed to be separated from the patterning slit sheet 950 by a predetermined distance. Alternatively, the deposition source 110 and the deposition source nozzle unit 920 coupled to the deposition source 110 may be connected to the patterning slit sheet 950 by a connection member 935. That is, the deposition source 910, the deposition source nozzle unit 920, and the patterning slit sheet 950 may be integrally formed as one body by being connected to each other via the connection member 935. The connection member 935 may guide the deposition material 915, which is discharged through the deposition source nozzles 921, to move straight in the Z-axis, not to flow in the X-axis direction. In FIG. 15, the connection members 935 are formed on left and right sides of the deposition source 910, the deposition source nozzle unit 920, and the patterning slit sheet 950 to guide the deposition material 915 not to flow in only the X-axis direction. However, the aspects of the present invention are not limited thereto. For example, the connection member 935 may be formed in the form of a sealed box to guide the flow of the deposition material 915 in both the X-axis and Y-axis directions.

As described above, the thin film deposition assembly 900 may perform deposition while being moved relative to the substrate 500. In order to move the thin film deposition assembly 900 relative to the substrate 500, the patterning slit sheet 950 is separated from the substrate 500 by the predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 900 according to an embodiment of the present invention, the patterning slit sheet 950 is disposed to be separated from the substrate 500 by the predetermined distance.

As described above, a mask is formed to be smaller than a substrate, and deposition is performed while the mask is moved relative to the substrate. Thus, the mask can be easily manufactured. In addition, it is possible to prevent occurrence of defects, caused by the contact between the substrate and the mask. In addition, since it is unnecessary to use the mask in close contact with the substrate during a deposition process, the manufacturing time may be reduced.

Figure 18:
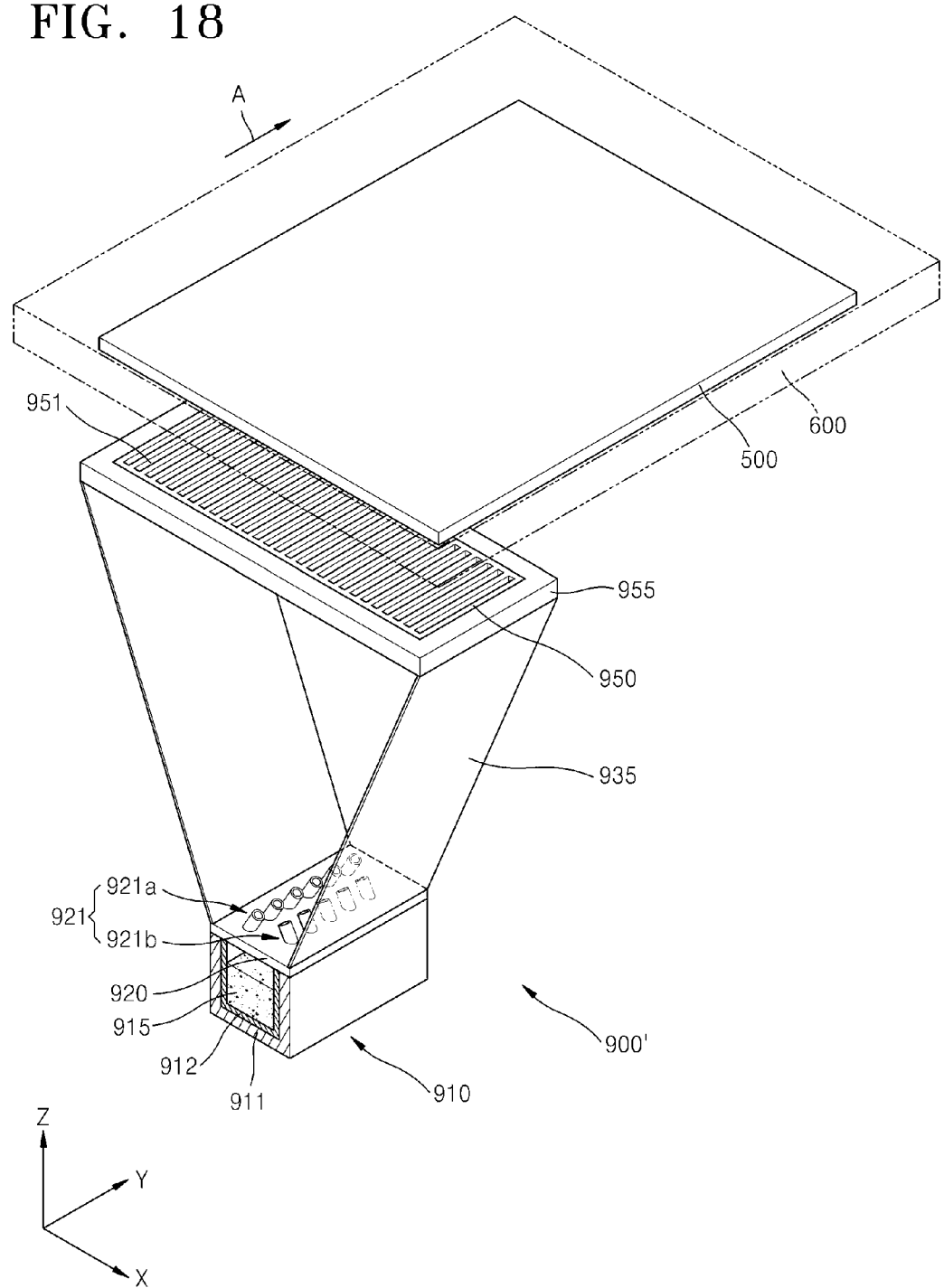
FIG. 18 is a schematic perspective view of a thin film deposition assembly according to an embodiment of the present invention.

FIG. 18 is a schematic perspective view of a thin film deposition apparatus 900' according to another embodiment of the present invention. Referring to FIG. 18, the thin film deposition apparatus 900' includes a deposition source 910, a deposition source nozzle unit 920, and a patterning slit sheet 950. The deposition source 910 includes a crucible 911 that is filled with a deposition material 915, and a heater 911 that heats the crucible 911 to vaporize the deposition material 915, which is contained in the crucible 911, so as to move the vaporized deposition material 915 to the deposition source nozzle unit 920. The deposition source nozzle unit 920 is disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and a substrate 500, and the patterning slit sheet 950 includes a plurality of patterning slits 951 arranged in the X-axis direction. In addition, the deposition source 910 and the deposition source nozzle unit 920 may be connected to the patterning slit sheet 950 by a connection member 935.

A plurality of deposition source nozzles 921 formed in the deposition source nozzle unit 920 are tilted at a predetermined angle, unlike the embodiment described with reference to FIG. 15. In particular, the deposition source nozzles 921 may include deposition source nozzles 921a and 921b arranged in respective rows. The deposition source nozzles 921a and 921b may be arranged in respective rows to alternate in a zigzag pattern. The deposition source nozzles 921a and 921b may be tilted by a predetermined angle with respect to an XZ plane.

That is, the deposition source nozzles 921a and 921b are arranged to tilt by a predetermined angle to each other. The deposition source nozzles 921a of a first row and the deposition source nozzles 921b of a second row may tilt to face each other. In other words, the deposition source nozzles 921a of the first row in a left part of the deposition source nozzle unit 920 may tilt to face a right side portion of the patterning slit sheet 950, and the deposition source nozzles 921b of the second row in a right part of the deposition source nozzle unit 920 may tilt to face a left side portion of the patterning slit sheet 950.

Figure 19:
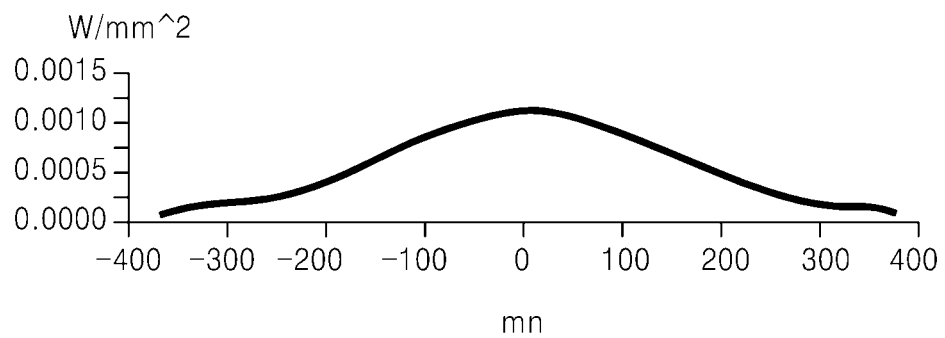
FIG. 19 is a graph schematically illustrating a distribution pattern of a deposition film formed on a substrate when a deposition source nozzle is not tilted in the thin film deposition assembly of FIG. 18, according to an embodiment of the present invention.
Figure 20:
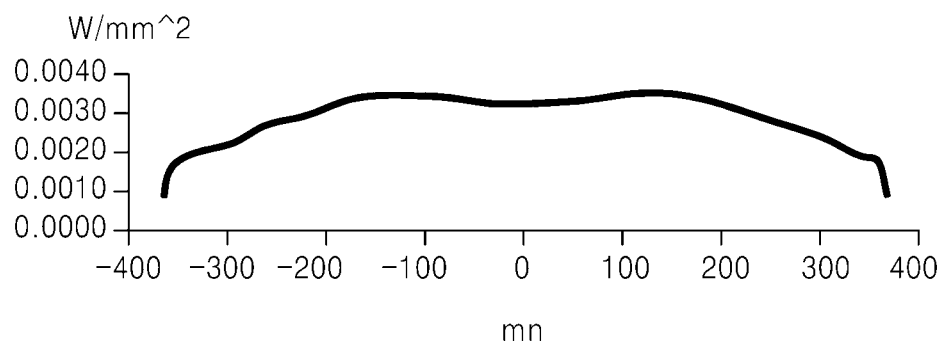
FIG. 20 is a graph schematically illustrating a distribution pattern of a deposition film formed on a substrate when a deposition source nozzle is tilted in the thin film deposition assembly of FIG. 18, according to another embodiment of the present invention.

FIG. 19 is a graph showing a distribution of a deposition film formed on the substrate 500 when the deposition source nozzles 921a and 921b are not tilted in the thin film deposition assembly 900 of FIG. 18, according to an embodiment of the present invention. FIG. 20 is a graph showing a distribution of a deposition film formed on the substrate 500 when the deposition source nozzles 921a and 921b are tilted in the thin film deposition assembly 900 of FIG. 18, according to another embodiment of the present invention. Comparing the graphs of FIGS. 19 and 20 with each other, the thickness of the deposition film formed on opposite end portions of the substrate 500 when the deposition source nozzles 921a and 921b are tilted, is greater than when the deposition source nozzles 921a and 921b are not tilted. Thus, the uniformity of the deposition film is improved when the deposition source nozzles 921a and 921b are tilted.

Accordingly, when the deposition source nozzles 921a and 921b are tilted, the deposition of the deposition material 915 may be adjusted to lessen a thickness variation between the center and the end portions of the substrate 500 and improve thickness uniformity of the deposition film. Moreover, utilization efficiency of the deposition material 915 may also be improved.

In a thin film deposition apparatus according to another embodiment of the present invention, two pairs of guide rails and a plurality of guide blocks combined with each of the guide rails are employed. Thus, a guide block may be returned back to a loading unit along one of the guide rails while deposition is performed on a substrate moving along another guide rail. Accordingly, it is possible to not only improve the degree of positioning accuracy with respect to the substrate but also continuously perform deposition without any pause. The thin film deposition apparatus has been described above with reference to FIG. 4, and thus will not be repeatedly described.

Figure 21:
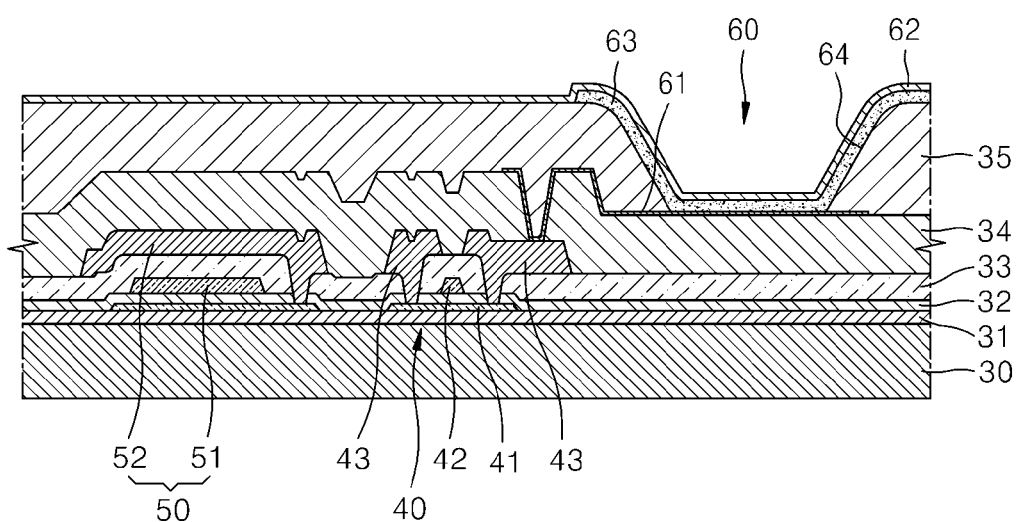
FIG. 21 is a cross-sectional view of an active matrix organic light-emitting display device fabricated by using a thin film deposition apparatus, according to an embodiment of the present invention.

FIG. 21 is a cross-sectional view of an active matrix organic light-emitting display device fabricated by using a thin film deposition apparatus, according to an embodiment of the present invention. Referring to FIG. 21, the active matrix organic light-emitting display device is formed on a substrate 30. The substrate 30 may be formed of a transparent material, for example, glass, plastic, or metal. An insulating layer 31, such as a buffer layer, is formed on an entire surface of the substrate 30.

A thin film transistor (TFT) 40, a capacitor 50, and an organic light-emitting diode (OLED) 60 are disposed on the insulating layer 31, as illustrated in FIG. 21.

A semiconductor active layer 41 is formed on the insulating layer 31 in a predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole for exposing parts of the semiconductor active layer 41.

Next, source and drain electrodes 43 are formed on the interlayer insulating layer 33 to contact the semiconductor active layer 41 exposed through the contact hole. A passivation layer 34 is formed to cover the source and drain electrodes 43, and is etched to expose a part of the drain electrode 43. An insulating layer (not shown) may be further formed on the passivation layer 34 so as to planarize the passivation layer 34.

In addition, the OLED 60 displays predetermined image information by emitting red, green, or blue light as current flows. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3, and the like. Such a low-molecular weight organic material may be deposited using vacuum deposition by using the thin film deposition apparatus described above with reference to FIG. 4.

After the opening 64 is formed in the pixel defining layer 35, the substrate 30 is transferred to a chamber, such as the one illustrated in FIGS. 1 and 2. Target organic materials are loaded into a first deposition source unit (not shown) and a second deposition source unit (not shown) for deposition. For example, when a host and a dopant are simultaneously deposited, a host material and a dopant material may be loaded into the first deposition source unit and the second deposition source unit, respectively.

After the organic emission layer 63 is formed, the second electrode 62 may be formed by the same deposition method as used to form the organic emission layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$) Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a layer of ITO, IZO, ZnO, or $In_2O_3$ on the reflective layer. The first electrode 61 may be formed by forming a layer, for example, by sputtering, and then patterning the layer, for example, by photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63, and forming an auxiliary electrode layer or a bus electrode line thereon from ITO, IZO, ZnO, $In_2O_3$, or the like. When the second electrode 62 is formed as a reflective electrode, the second electrode 62 may be formed by depositing Li, Ca, LiF/Ca, LiF/Al, Al, Ag, Mg, or a compound thereof on the entire surface of the organic emission layer 63. The second electrode 62 may be formed by using the same deposition method as used to form the intermediate layer 63 described above.

The thin film deposition apparatuses according to the embodiments of the present invention described above may be used to not only form an organic layer or an inorganic layer of an organic TFT but also form layers from various materials.

As described above, in a thin film deposition apparatus according to an aspect of the present invention and a method of manufacturing an organic light-emitting display device according to an aspects of the present invention by using the thin film deposition apparatus, the thin film deposition apparatus may be easily used to the manufacture of large-sized display devices on a mass scale. In addition, the thin film deposition apparatus and the organic-light-emitting display device may be easily manufactured, may improve manufacturing yield and deposition efficiency, and may allow deposition materials to be reused.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting display device by using a thin film deposition apparatus, the apparatus including a loading unit to arrange a substrate, which is a deposition target, on an electrostatic chuck, a deposition unit including a thin film deposition assembly to form a thin film on the substrate, and an unloading unit to separate the substrate on which deposition is completed from the electrostatic chuck, the method comprising:
   arranging the substrate on the electrostatic chuck by using the loading unit;
   disposing the electrostatic chuck having the substrate thereon either on a first guide block moving along a first guide rail in a first direction or on a second guide block moving along a second guide rail in the first direction;
   depositing a deposition material discharged from the thin film deposition apparatus on the substrate while the substrate or the thin film deposition apparatus is moved relative to the other;
   separating the electrostatic chuck from said either the first or second guide block by using the unloading unit; and
   returning said either the first or second guide block on respective said first or second guide rail in a return direction opposite to the first direction toward the loading unit,
   wherein the first guide block remains on the first guide rail and the second guide block remains on the second guide rail.

2. The method of claim 1, wherein the electrostatic chuck comprises:
   a first electrostatic chuck disposed on the first guide block; and
   a second electrostatic chuck disposed on the second guide block.

3. The method of claim 2, wherein a portion of the first electrostatic chuck facing the second guide block comprises a first groove, and
   a portion of the second electrostatic chuck facing the first guide block comprises a second groove.

4. The method of claim 2, wherein a portion of the first electrostatic chuck facing the second guide rail is separated from the second guide rail by a distance at least equal to a height of the second guide block above the second guide rail, and
   a portion of the second electrostatic chuck facing the first guide rail is separated from the first guide rail by a distance at least equal to a height of the first guide block above the first guide rail.

5. The method of claim 1, wherein the first guide rail and the second guide rail are linear motion rails, and
   the first guide block and the second guide block are linear motion blocks.

6. The method of claim 1, wherein a plurality of thin film deposition assemblies are disposed in a chamber so as to continuously perform deposition on the substrate.

7. The method of claim 1, wherein a chamber comprises:
   a first chamber in which a plurality of thin film deposition assemblies are disposed; and
   a second chamber in which a plurality of thin film deposition assemblies are disposed,
   wherein deposition is continuously performed while the substrate is moved between the first chamber and the second chamber.

8. The method of claim 1, wherein the deposition unit further comprises a chamber, and the thin film deposition assembly is in the chamber, and the thin film deposition apparatus further comprises:
   a first conveyor unit to sequentially move the electrostatic chuck to the loading unit to arrange the substrate thereon, to the deposition unit, and finally, to the unloading unit to remove the substrate,
   wherein the first conveyor unit comprises:
   one pair of first guide rails disposed in parallel comprising the first guide rail and one pair of second guide rails disposed in parallel comprising the second guide rail;
   at least one first guide block comprising the first guide block engaged with at least one of the first guide rails, respectively; and
   at least one second guide block comprising the second guide block engaged with at least one of the second guide rails, respectively.

9. The method of claim 8, wherein the two pairs of first and second guide rails are formed to pass through the chamber,
   the first guide rails are disposed along outer portions of the second guide rails, respectively,
   the at least one first guide block moves in a linear reciprocating manner along one of the pair of the first guide rails, and
   the at least one second guide block moves in a linear reciprocating manner along one of the pair of the second guide rails.

10. The method of claim 9, wherein the at least one first guide block and the at least one second guide block independently move in a linear reciprocating manner along the first direction and the return direction.

11. The method of claim 8, wherein the thin film deposition assembly comprises:
   a deposition source to discharge a deposition material;
   a deposition source nozzle unit disposed at a side of the deposition source and including a plurality of deposition source nozzles arranged in a first direction;
   a patterning slit sheet disposed opposite to the deposition source nozzle unit and including a plurality of patterning slits arranged in the first direction; and
   a barrier plate assembly including a plurality of barrier plates that are disposed between the deposition source nozzle unit and the patterning slit sheet in the first direction, and partition a space between the deposition source nozzle unit and the patterning slit sheet into a plurality of sub-deposition spaces,
   wherein the thin film deposition assembly is separated from the substrate, and
   the thin film deposition assembly or the substrate is moved relative to the other.

12. The method of claim 11, wherein the patterning slit sheet of the thin film deposition apparatus is smaller than the substrate.

13. The method of claim 11, wherein the plurality of barrier plates extend in a second direction substantially perpendicular to the first direction.

14. The method of claim 11, wherein the plurality of barrier plates are arranged at equal intervals.

15. The method of claim 11, wherein the barrier plate assembly comprises:
   a first barrier plate assembly including a plurality of first barrier plates; and
   a second barrier plate assembly including a plurality of second barrier plates.

16. The method of claim 15, wherein the first barrier plates and the second barrier plates extend in a second direction substantially perpendicular to the first direction.

17. The method of claim 16, wherein a position of the first barrier plates are arranged to correspond to a position of the second barrier plates, respectively.

18. The method of claim 17, wherein each pair of the corresponding first and second barrier plates is arranged on substantially the same plane.

19. The method of claim 15, wherein the first barrier plates and the second barrier plates have a same thickness in the first direction.

20. The method of claim 15, wherein the second barrier plates are thinner than the first barrier plates in the first direction.

21. The method of claim 1, wherein the thin film deposition assembly comprises:
   a deposition source to discharge a deposition material;
   a deposition source nozzle unit disposed at a side of the deposition source and including a plurality of deposition source nozzles arranged in a first direction; and
   a patterning slit sheet disposed opposite to the deposition source nozzle unit and including a plurality of patterning slits arranged in a second direction perpendicular to the first direction,
   wherein deposition is performed while the substrate or the thin film deposition apparatus is moved relative to the other in the first direction, and
   the deposition source, the deposition source nozzle unit, and the patterning slit sheet are formed integrally with one another.

22. The method of claim 21, wherein the deposition source and the deposition source nozzle unit are connected to the patterning slit sheet by a connection member.

23. The method of claim 22, wherein the connection member guides movement of the discharged deposition material.

24. The method of claim 22, wherein the connection member seals a space between the deposition source, the deposition source nozzle unit, and the patterning slit sheet.

25. The method of claim 24, wherein the thin film deposition apparatus is separated from the substrate by a predetermined distance.

26. The method of claim 24, wherein the deposition material discharged from the thin film deposition apparatus is continuously deposited on the substrate while the substrate or the thin film deposition apparatus is moved relative to the other in the first direction.

27. The method of claim 24, wherein the patterning slit sheet of the thin film deposition apparatus is smaller than the substrate.

28. The method of claim 24, wherein the plurality of deposition source nozzles are tilted at a predetermined angle.

29. The method of claim 28, wherein the plurality of deposition source nozzles comprise deposition source nozzles arranged in two rows formed in the first direction, and
   the deposition source nozzles in the two rows are tilted to face each other.

30. The method of claim 27, wherein the plurality of deposition source nozzles comprise deposition source nozzles arranged in two rows formed in the first direction,
   the deposition source nozzles of a row located at a first side of the patterning slit sheet are arranged to face a second side of the patterning slit sheet, and
   the deposition source nozzles of the other row located at the second side of the patterning slit sheet are arranged to face the first side of the patterning slit sheet.

* * * * *